United States Patent [19]
Bennett et al.

[11] Patent Number: 6,144,486
[45] Date of Patent: Nov. 7, 2000

[54] PUMP WAVELENGTH TUNING OF OPTICAL AMPLIFIERS AND USE OF SAME IN WAVELENGTH DIVISION MULTIPLEXED SYSTEMS

[75] Inventors: Kevin W. Bennett, Painted Post, N.Y.; Fiona Davis, Bishop's Stortford, United Kingdom; Richard A. Habel, Ottawa, Canada; Paul A. Jakobson, Big Flats, N.Y.; Nigel E. Jolley, Harlow, United Kingdom; Robert W. Keys, Kanata, Canada; Kim Byron Roberts, Welwyn Garden City, United Kingdom; Mark A. Newhouse; Michael J. Yadlowsky, both of Corning, N.Y.

[73] Assignees: Corning Incorporated, Corning, N.Y.; Northern Telecom Limited, Montreal, Canada

[21] Appl. No.: 09/016,184

[22] Filed: Jan. 30, 1998

[51] Int. Cl.[7] .................................................... H01S 3/00
[52] U.S. Cl. ............................................. 359/341; 359/345
[58] Field of Search .................................... 359/341, 345, 359/124; 372/6

[56] References Cited

U.S. PATENT DOCUMENTS

| | | |
|---|---|---|
| 5,260,823 | 11/1993 | Payne et al. . |
| 5,287,216 | 2/1994 | Chirravuri et al. . |
| 5,333,089 | 7/1994 | Heidemann . |
| 5,363,385 | 11/1994 | Heidemann . |
| 5,406,404 | 4/1995 | DiGiovanni et al. . |
| 5,506,724 | 4/1996 | Shimizu et al. . |
| 5,696,615 | 12/1997 | Alexander . |
| 5,745,283 | 4/1998 | Inagaki et al. ........................... 359/341 |

FOREIGN PATENT DOCUMENTS

| | | |
|---|---|---|
| 0 476 830 | 3/1992 | European Pat. Off. . |
| 5-291676 | 5/1993 | Japan . |
| 07202299 | 8/1995 | Japan . |
| 2278230 | 11/1994 | United Kingdom . |
| 2293684 | 4/1996 | United Kingdom . |

OTHER PUBLICATIONS

Becker et al., *Erbium–Doped Fiber Amplifier pumped in the 950–1000 nm Region*, IEEE Photonics Technology Letters, vol. 2, No. 1, Jan. 1990, pp. 35–37.

(List continued on next page.)

*Primary Examiner*—Mark Hellner
*Attorney, Agent, or Firm*—William Greener; Svetlana Short

[57] ABSTRACT

The variables and parameters previously understood to affect the gain spectrum of an optical amplifier 13 were: (1) the wavelengths to be amplified; (2) the input power levels at those wavelengths; (3) the characteristics of the amplifying medium 20; (4) the insertion loss spectra of the amplifier's components, including any filter(s) used for gain flattening; (5) the pump band chosen to pump the amplifying medium 20; and (6) the total amount of pump power supplied in the chosen pump band. An additional fundamental variable has been identified which can be used to control the gain spectrum of an optical amplifier 13, namely, the center wavelength of the spectrum of the pump's output power within the chosen pump band. Methods and apparatus for using this variable for this purpose are disclosed.

For example a, transmission system is disclosed having a transmitter 11 and a receiver 10 connected by an optical fiber 12. A plurality of optical amplifiers 13 are located along the optical fiber 12 to amplify signal channels between the transmitter and receiver. Each of the amplifiers has a pump light source 21, the wavelength of which is such that contributions to differential gain due to pump light wavelength related effects is substantially reduced.

Also disclosed is a WDM transmission system having a transmission path including a concatenation of laser diode pumped optical amplifiers 13 wherein the gain spectrum of an amplifier is controlled at least in part by a feedback loop regulating the temperature of its laser diode pump 21. The feedback loop may for instance derive its control signal from a measure of the drive current applied to the pump, of the emission wavelength of the pump, or of the disparity between the power output from the amplifier in one of the multiplexed signal channels and that from at least one other of the channels.

69 Claims, 17 Drawing Sheets

OTHER PUBLICATIONS

Lidgard et al., *Output saturation characteristics of erbium–doped fiber amplifiers pumped at 975 nm*, Applied Physics letter 56 (26), pp. 2607–2609.

Giles et al., *Modeling Erbium–Doped Fiber Amplifiers*, Journal of Lightwave Technology, vol. 9, No. 2, Feb. 1991, pp. 271–283.

Giles et al., *Optical Amplifiers Transform Long–Distance Lightwave Telecommunications*, Proceedings of the IEEE, vol. 84, Jun. 1996, pp. 870–883.

Tachibana et al., *Gain cross saturation and spectral hole burning in wideband erbium–doped fiber amplifiers*, Optics Letters, Oct. 1, 1991, vol. 16, pp. 1499–1501.

Chou et al., *Inhomogeneous Gain Saturation of Erbium–Doped Fiber Amplifiers*, Proceedings, Optical Amplifiers and their Application, Davos, Switzerland, 1995, pp. 92–95.

Srivastava et al., *Room temperature spectral hole–burning in erbium–doped fiber amplifiers*, Proceedings, Optical Fiber Communication Conference, San Jose, CA, 1996 (TuG7), pp. 33–34.

Desurvire et al., *Spectral Gain Hole–Burning at 1.53µm in Erbium–Doped Fiber Amplifiers*, IEEE Photonics Technology Letters, vol. 2, No. 4, Apr. 1990, pp. 246–248.

Zyskind et al., *Determination of Homogeneous Linewidth by Spectral Gain Hole–Burning in an Erbium–doped Fiber Amplifier with $GeO_2$:$SiO_2$ Core*, IEEE Photinics Technology Letters, vol. 2, No. 12, Dec. 1990, pp. 869–871.

Desurvire et al., *Study of Spectral Dependence of Gain Saturation and Effect of Inhomogenous Broadening in Erbium–Doped Aluminosilicate Fiber Amplifiers*, IEEE Photonics Technology Letters, vol. 2, No. 9, Sep. 1990, pp. 653–655.

Yoshikuni et al., *Multielectrode Distributed Feedback Laser for Pure Frequency Modulation and Chirping Suppressed amplitude Modulation*, Journal of Lightwave Technology, vol. LT5, No. 4, Apr. 1987, pp. 516–522.

Giles et al., *Simultaneous Wavelength–Stabilization of 980–nm Pump Lasers*, IEEE Photonics Technology Letters, vol. 6, No. 8, Aug. 1994, pp. 907–909.

Bennett et al., *980 nm band wavelength tuning of the gain spectrum of EDFAs*, Proceedings of Optical Amplifiers and their Applications, Topical Meeting—OSA Trends in Optics and Photonics Series (ISBN 1 55652 505 6), Victoria, BC, Canada, Jul. 21–23, 1997, vol. 16, pp. 152–155.

Yu et al., *Gain and Noise Spectrum Properties of Gain–Shaped Erbium Doped Fibre Amplifiers Using Equalalising Filters*, Proceedings of the European Conference on Optical Communication (EC Regular Papers, Berlin, Sep. 27–Oct. 1, 1992 Bound as One with vol. 2 & 3, vol. 1, No. CONF. 18, Sep. 27, 1992, pp. 481–484.

Hiromu Toba, *A 100–Channel Optical FDM Six–Stage In–Line Amplifier System Employing tunable Gain Equalizers*, IEEE Photonics Technology Letters, vol. 5, No. 2, Feb. 1, 1993, pp. 248–251.

Kazunori Suzuki et al., *Pumping Wavelength Dependence on Gain Factor of a 0.98 M Pumped ER3+ Fiber Amplifier*, Applied Physics Letters, vol. 55, No. 25, Dec. 18, 1989, pp. 2573–2575.

PUMP WAVELENGTH TUNING OF OPTICAL AMPLIFIERS AND USE OF SAME IN WAVELENGTH DIVISION MULTIPLEXED SYSTEMS

FIELD OF THE INVENTION

This invention relates to optical amplifiers and, in particular, to the operation of optical amplifiers used in lightwave transmission systems. Even more particularly, the invention relates to optical amplifiers in which the problem of differential signal gain is addressed, and to wavelength division multiplexed transmission system having a plurality of such optical amplifiers.

BACKGROUND OF THE INVENTION

I. Optical Amplifiers

The basic elements of a communication system are a transmitter, a receiver, and a transmission medium. Optical fibers are today the transmission medium of choice for sending voice, video, and data signals over long distances. Although modern fibers have very low losses per unit length, long fiber spans, e.g., cables extending from one city to another, require periodic amplification of the transmitted signal to ensure accurate reception at the receiver.

Erbium doped fiber amplifiers have been developed to satisfy this need for signal amplification. Such amplifiers consist of a length of optical waveguide fiber, e.g., 5 to 30 meters of fiber, which has been doped with erbium. The quantum mechanical structure of erbium ions in a glass matrix allows for stimulated emission in the ~1500 to ~1600 nanometer range, which is one of the ranges in which optical waveguide fibers composed of silica exhibit low loss. As a result of such stimulated emission, a weak input signal can achieve more than a hundred fold amplification as it passes through a fiber amplifier.

To achieve such stimulated emission, the erbium ions must be pumped into an excited electronic state. Such pumping can take place in various pump bands, the most effective of which include those having midpoint wavelengths of ~980 nanometers and ~1480 nanometers. Efficient semiconductor laser sources are available for both of these pump bands. As would be expected, trade-offs exist between these pump bands, with the 980 band providing lower noise in the amplified signal and the 1480 band providing a lower propagation loss for the pump light, which is of value when remote pumping is to be performed.

Although stimulated emission occurs throughout the 1500 to 1600 nanometer range, the amount of amplification achieved is not uniform throughout this range. These variations in gain produce problems in multiplexed systems where a group of wavelengths are used to simultaneously transmit multiple signals down an optical fiber. Such multiplexing is of great commercial value since it allows significantly increased transmission capacity per fiber. Indeed, a current priority in the telecommunications industry is to upgrade existing one wavelength transmission systems to a multi-wavelength environment in a cost effective manner so as to address the ever increasing demand for greater signal carrying capacity.

In a typical application, a multi-wavelength signal carried on an optical fiber will be subjected to repeated rounds of amplification as it passes from the transmitter to the receiver. At each such stage, any differences in amplification which may exist at the various wavelengths will compound, with the wavelengths subject to more amplification becoming ever stronger at the expense of those subject to less amplification. Various approaches have been used in the art to address this non-uniform amplification problem.

One of the most basic approaches involves the selection of the wavelengths used to transmit the multiple signals. As is well known in the art, the gain spectrum of an erbium doped fiber amplifier is flatter in the "red band," i.e., in the longer wavelength region from about 1540–1545 nanometers to about 1565 nanometers, than in the "blue band," i.e., in the shorter wavelength region from about 1525 nanometers to about 1535–1540 nanometers. In particular, a very flat gain in the red band can be achieved by adjusting the fraction of erbium ions in the excited ("inverted") state through the selection of the length of the fiber amplifier and the level of pumping applied to the fiber.

To take advantage of this flatness, wavelength multiplexed systems employing erbium doped fiber amplifiers have had their signal channels in the red band. In addition, to address residual non-uniform gain, the signal input powers at the transmitter have been adjusted to take account in advance of the differential amplification which will occur as the signal is repeatedly amplified during its passage to the receiver.

To expand the useable wavelength range provided by erbium doped fiber amplifiers into the blue band, filters have been proposed to flatten the amplifier's gain spectrum. The standard assumption which is made in designing a practical filter for this purpose is that the gain of the amplifier is essentially "homogeneous" in character, i.e., that the gain can be described by the homogeneous model discussed in, for example, C R Giles, et al., "Modeling erbium-doped fiber amplifiers", *J Lightwave Tech*, vol. 9, pp. 271–283, 1991, and C R Giles, et al., "Optical amplifiers transform long-distance lightwave telecommunications", *Proc IEEE*, vol. 84, pp. 870–883, 1996. The essence of this assumption is that the gain of an amplifier is determined by the average inversion of the active species, e.g., the erbium ions in an erbium doped fiber amplifier, irrespective of the particular signal wavelengths, signal powers, pump wavelength, and pump power which produced that average inversion. Looked at another way, the assumption of homogeneous broadening means that if the gain at any one wavelength is by some means stabilized to a particular value then a gain at the other wavelengths is similarly stabilized (the stabilized value of the gain being different at different wavelengths).

By means of this assumption, a gain spectrum for an amplifier is calculated for a given average inversion and that gain spectrum is used to design a filter which can flatten the spectrum. A set of signal wavelengths when applied to the amplifier will then see a flattened gain spectrum provided that the average inversion in the presence of those signal wavelengths is the average inversion used in the design of the filter. The degree of flattening will, of course, depend on how well a manufactured filter actually has the desired attenuation spectrum.

Rather than calculating the gain spectrum using the homogeneous model, one could, for example, measure the gain spectrum of an actual amplifier and use that measured gain spectrum to design the filter. This empirical approach, however, also implicitly adopts the homogeneous model in that it is assumed that the gain spectrum will be flattened for any set of signal wavelengths and powers within the amplifier's operating range that has the same average inversion as that which existed when the empirical gain spectrum was measured.

The above approaches for implementing a gain flattening filter work well for signal wavelengths in the red band.

Surprisingly, in accordance with the invention, it has been discovered that the homogeneous model does not work well in the blue band. Rather, this band exhibits substantial inhomogeneous behavior. Specifically, when at least one signal wavelength is in this band, the gain spectrum can no longer be described by a single average inversion which applies to all active species. This inhomogeneity leads to a variety of important consequences in connection with the design, implementation, and use of optical amplifiers, components of such amplifiers, and systems employing such amplifiers.

Inhomogeneous line broadening in erbium doped fiber amplifiers (EDFAs), in particular, "hole burning," has been reported in the literature. As described therein, this effect has a line width (an affected portion of the spectrum) of about 10 nm. The effect is dependent upon the degree of saturation of the amplifier and is always centered at the saturating signal wavelength. Discussions of the hole burning effect can be found in M Tachibana, et al., "Gain cross saturation and spectral hole burning in wideband erbium-doped fiber amplifiers", *Opt Lett,* vol. 16, pp. 1499–1501, 1991; H Chou, et al., "Inhomogeneous gain saturation of erbium-doped fiber amplifiers", in Proc. *Optical Amplifiers and their Application,* Davos, Switzerland, 1995, pp. 92–95; and A K Srivastava, et al., "Room temperature spectral hole-burning in erbium-doped fiber amplifiers", in Proc. *Optical Fiber Communication Conference,* San Jose, Calif., 1996, (Tu G7), pp. 33–34. For other discussions of inhomogeneous effects in EDFAs see E Desurvire, et al., "Gain hole-burning at 1.53 $\mu$m in erbium-doped fiber amplifiers", *IEEE Phot Tech Let,* vol. 2, pp. 246–248, 1990; J L Zyskind, et al., "Determination of homogenous linewidth by spectral gain hole-burning in an erbium-doped fiber amplifier with $GeO_2:SiO_2$ core", *IEEE Phot Tech Let,* vol. 2, pp. 869–871, 1990; and E Desurvire, et al., "Study of spectral dependence of gain saturation and effect of inhomogeneous broadening in erbium-doped aluminosilicate fiber amplifiers", *IEEE Phot Tech Let,* vol. 2, pp. 653–655, 1990.

Significantly, the reported inhomogeneous effects have been small, e.g., at most one dB. In contrast, in accordance with the invention, multi-dB distortions in the gain spectrum of EDFAs have been observed as a result of having at least one signal wavelength in the blue band.

II. Gain Tilt in WDM Transmission Systems

In wavelength division multiplexed (WDM) transmission systems that employ known optically pumped optical amplifiers in their transmission paths the phenomenon of gain tilt presents problems. Under different operating conditions, the amplifier amplifies the different channels to different relative extents such that any passive system that is designed to equalize the power output of the channels for one specific set of operating conditions is liable to fail to provide equalization when those conditions are changed. One of the aspects of the invention involves minimizing the adverse effects of this gain tilt phenomenon.

SUMMARY OF THE INVENTION

A new and hitherto unreported effect has been observed by us, namely, the fact that in respect of an optically pumped optical amplifier saturated at a particular wavelength within its gain spectrum, for instance an erbium doped fiber amplifier pumped in the 980 nm band and amplifying in the 1525 to 1570 nm band, the shape of the gain spectrum varies significantly with pump wavelength within a spectral range over which there is no significant change in absorption of the pump power by the amplifier.

This effect has been observed by setting the power delivered to the amplifier by the pump to a fixed power level, and then making a change of about 5 nm to the pump wavelength. Over this range of wavelength there is about an 8% change in absorption of the pump power by the fiber amplifier. Significantly, in accordance with the invention, the shape of the gain spectrum in the wavelength range from 1525 nm to 1540 nm is unexpectedly found to alter substantially and more than for the red band (1540 nm to 1570 nm). The effect is therefore much more sensitive to pump wavelength than previously observed effects.

The shape of the gain spectrum within the 1525 nm to 1540 nm wavelength range has been seen to change by 0.5 dB for a 0.8 nm change in pump wavelength. Lack of adequate control of pump wavelength can therefore seriously impair the operation of optical amplifiers of an optically amplified transmission system amplifying WDM channels within this waveband.

This effect has hitherto not been detected and at present pump wavelengths are randomly selected, generally to fall within the absorption band of the erbium-doped fiber, as illustrated in FIG. 9. Furthermore, in order to reduce the length of fiber required to provide a preset gain, sources close to the absorption peak have been considered preferable.

One possible cause of this new effect could be inhomogeneous broadening in the absorption band of the erbium-doped fiber. This may be due to different erbium ions located in different sites throughout the fiber encountering different field effects. Thus, different pump wavelengths will pump ions in different sites selectively, these ions emitting selectively at certain wavelengths. Thus, different pump wavelengths will produce different gain at different signal wavelengths.

In accordance with certain of its aspects the invention uses fine control (fine tuning) of the pump's center wavelength, e.g., control to within about two nanometers, preferably within about one nanometer, and more preferably to within about a half a nanometer or less, to manage the substantial inhomogeneous behavior exhibited by optical amplifiers for signals in the blue band. In this way, the shape of the gain spectrum of an optical amplifier can be adjusted to achieve desired amplification levels at a desired set of signal wavelengths, signal powers, and pump power.

Prior to the present invention, some of the principal variables/parameters which were understood to affect the gain spectrum of an optical amplifier were: (1) the wavelengths to be amplified; (2) the input power levels at those wavelengths; (3) the characteristics of the amplifying medium, e.g., its composition, length, and doping level; (4) the insertion loss spectra of the amplifier's components, including any filter(s) used for gain flattening; (5) the pump band chosen to pump the amplifying medium; and (6) the total amount of pump power supplied in the chosen pump band.

As discussed above, in accordance with the invention, a further fundamental variable has been identified which can be used to control the gain spectrum of an optical amplifier. That variable is the center wavelength of the spectrum of a pump's output power within the chosen pump band. By using this variable in combination with the other variables/parameters listed above enhanced amplifier performance is achieved.

For ease of reference, adjustment of the center wavelength of the spectrum of a pump's output power within a selected pumping band, i.e., fine tuning of the center wavelength, will be referred to herein as "pump wavelength tuning."

In certain embodiments of the invention, pump wavelength tuning is combined with component selection, specifically, selection of pumps and gain flattening filters, to improve overall amplifier performance. Specifically, due to manufacturing tolerances, semiconductor laser pumps vary in their midpoint wavelength. Similarly, the attenuation spectrum of a gain flattening filter varies from sample to sample. In some cases, these component variations can combine such that the amount of pump wavelength tuning needed to obtain a desired gain spectrum for an optical amplifier cannot be readily achieved for a particular pump sample and filter sample. In accordance with the invention, this problem is solved by prescreening pump samples and filter samples so that the sample combination used in a particular amplifier can achieve a desired gain spectrum through pump wavelength tuning. In this way, manufacturing reject levels are reduced.

Components, e.g., filters used for gain flattening, can, for example, undergo changes due to, among other things, aging and the environment in which they are used. For example, the attenuation peak of a gain flattening filter will change with temperature. Pump wavelength tuning can be used to compensate for this variation.

In another embodiment, pump wavelength tuning can be used to compensate for the effects of gain spectrum changes due to changes in signal input power and spectrum.

In other embodiments, instead of using a single pump with a single center wavelength, multiple pumps having different center wavelengths within the chosen pump band are used to provide further control over the shape of the gain spectrum. In this way, optical amplifiers can be designed to handle more complex sets of signal wavelengths, signal powers, and pump powers.

In addition to controlling the center wavelength of the pump or pumps of a single amplifier, the center wavelengths of the pumps of a cascaded series of amplifiers can be fine tuned to achieve an overall performance objective, e.g., the center wavelengths of pumps for downstream amplifiers can be adjusted to take account of effects of amplified spontaneous emission (ASE) produced by upstream and/or downstream amplifiers.

Other aspects of the present invention include the following:

The provision of a method of operating an optical amplifier having an optically amplifying medium optically pumped with a semi-conductor laser, in which method the shape of the gain spectrum is regulated by dynamic control of the emission wavelength of the laser.

The provision of an optical amplifier having an optically amplifying medium optically pumped with a semiconductor laser, the amplifier including control means that regulates the shape of the gain spectrum by dynamic control of the emission wavelength of the laser.

The provision of a method of operating an optical amplifier having an optically amplifying medium optically pumped with a semiconductor laser, in which method a feedback control loop is employed to control the magnitude of pump power delivered to the amplifying medium by the laser, and adjustment means is employed to modify the change in emission wavelength that results directly from changes in said delivered pump power.

The provision of an optical amplifier having an optically amplifying medium optically pumped with a semiconductor laser, the amplifier including feedback means controlling the magnitude of pump power delivered to the amplifying medium by the laser, and including adjustment means that modifies the change in emission wavelength that results directly from changes in said delivered pump power.

One way of exercising dynamic control over the emission wavelength of the semiconductor laser in accordance with the above aspects of the invention involves the use of a dynamically wavelength adjustable narrow-band laser optical cavity defining reflector as an external reflector of an external cavity semiconductor laser. Such a reflector may be constituted by a Bragg reflection grating in a length of single mode optical fiber that is dynamically stretched, for instance peizo electrically. An alternative way involves the use of three-terminal semiconductor laser such as described by Y. Yoshikuni and G Motosugi in the paper entitled "Multielectrode Distributed Feedback Laser for Pure Frequency Modulation and Chirping Suppressed Amplitude Modulation," *Journal of Lightwave Technology,* Vol LT5, No. 4, April 1987, pp 516–522. A preferred way involves exercising dynamic control over the temperature of the semiconductor laser.

According to a further aspect of the present invention there is provided an optical amplifier having an optically amplifying medium optically pumped with a laser diode whose temperature is dynamically regulated at least in part by a signal derived from a measured operating parameter of the amplifier.

According to another aspect of the invention, in a wavelength division multiplexed transmission system having a receiver optically coupled with a transmitter via a wavelength division multiplexed transmission path that includes a concatenation of laser diode pumped optical amplifiers, each of which exhibits a gain spectrum, the invention provides a method of adjusting the gain spectrum of at least one of said amplifiers by dynamically regulating the temperature of its laser diode pump in response to a measured operating parameter of said amplifier, or of said system.

The emission wavelength of a typical diode laser emitting at 980 nm can be shifted by 0.8 nm by a 2.5° C. temperature change, or a 40 mA change in drive current. This corresponds to wavelength change coefficients of 0.32 nm/°C. and 0.02 nm/mA, respectively, and represents intrinsic properties of the diode laser. Accordingly, if an amplifier specification calls for the pump drive current to be adjustable over a range of not more than 200 mA, keeping the diode at a constant temperature will ensure that the emission wavelength is kept with a 5 nm range, thereby ensuring that absorption of the pump power by the amplifier remains substantially constant. On the other hand it will not ensure that the pump wavelength mediated differential gain effects discussed above are kept to an insignificant level. In other words, whereas stabilizing the temperature of a diode pump laser is sufficient to eliminate amplifier operational problems attributable to pump power absorption efficiency, it is by no means sufficient to eliminate those attributable to the newly discovered pump wavelength mediated differential gain effects.

According to one preferred feature of the present invention, the pump's temperature regulating signal is derived from a measure of the pump's drive current.

According to an alternative preferred feature, the signal is derived from a measure of the pump's emission wavelength.

According to a further alternative preferred feature, the signal is derived from a measure of differential gain afforded by the amplifier to traffic in different wavelengths.

In a transmission system having a concatenation of optical amplifiers in its transmission path, the signal derived from a measure of the differential gain afforded by an amplifier to traffic in different wavelengths can be employed not just simply for regulation of the temperature of the diode laser pump of that particular amplifier, but also that of diode laser pumps of some or all of the other optical amplifiers in the transmission path, particularly of those amplifiers upstream in the transmission path.

Still further aspects of the invention include:

The provision of a transmission system having a transmitter and a receiver connected by an optical fiber, and a plurality of optical amplifiers located along said optical fiber to amplify signal channels between said transmitter and receiver, each of said amplifiers having a pump light source the wavelength of which is such that contributions to differential gain due to pump light wavelength related effects are substantially reduced.

The provision of a transmission system having a plurality of optical amplifiers, each optical amplifier comprising an erbium-doped silica fiber and a source of pump light, wherein the wavelength of the source lies within a range of 970 nm to 977 nm or 981 nm to 986 nm. More preferably, the wavelength of the pump source lies within the range of 974 nm to 975 nm or 981 nm to 983 nm. Most preferably, the wavelength of the pump source lies in the range 974.5 nm to 975 nm or 982 nm to 983 nm.

The provision of a transmission system having a plurality of optical amplifiers arranged to amplify signals the wavelengths of which lie in the range 1530 nm to 1565 nm, each optical amplifier comprising an erbium-doped silica fiber and a source of pump light, wherein the wavelength of the source lies within a range 970 nm to 977 nm or 981 nm to 986 nm. More preferably, the wavelength of the pump source lies within the range 974 nm to 976 nm or 981 nm to 984 nm. Most preferably, the wavelength of the pump source lies within the range 974 nm to 975 nm or 982 nm to 983 nm.

The provision of a transmission system having a plurality of optical amplifiers, each optical amplifier comprising an erbium-doped silica fiber and a source of pump light, wherein the wavelength of the source lies within a 2 nm waveband in the range of 970 nm to 975 nm or 982 nm to 986 nm. More preferably, the wavelength of the source lies within a 1 nm waveband in the range of 970 nm to 975 nm or 981 nm to 986 nm. Most preferably, the wavelength of the source lies within a 0.5 nm waveband in the range of 970 nm to 976 nm or 981 nm to 986 nm.

The provision of a transmission system having a plurality of optical amplifiers arranged to amplify signals the wavelengths of which lie in the range 1530 nm to 1565 nm, each optical amplifier comprising an erbium-doped silica optical fiber and a source of pump light, wherein the wavelength of the source lies within a 2 nm waveband in the range of 970 nm to 977 nm or 981 nm to 986 nm. More preferably, the wavelength of the source lies within a 1 nm waveband in the range of 970 nm to 977 nm or 981 nm to 986 nm. Most preferably, the wavelength of the source lies within a 0.5 nm bandwidth in the range of 970 nm to 977 nm or 981 nm to 986 nm.

In accordance with the foregoing aspects, most preferably, each source of pump light is a semi-conductor laser.

Additional aspects of the invention include:

The provision of a method of pumping an erbium-doped silica optical fiber, including selecting a pump light source having a wavelength such that differential gain due to pump light wavelength related effects is substantially reduced.

The provision of a method of operating a transmission system having a transmitter and a receiver connected by an optical fiber, and a plurality of optical amplifiers located along said optical fiber to amplify signal channels between said transmitter and receiver, each of said amplifiers having a pump light source, said method including selecting the wavelength of said source such that contributions to differential gain due to pump light wavelength related effects is substantially reduced.

The provision of a method of operating a transmission system having a plurality of optical amplifiers, each optical amplifier comprising an erbium-doped silica fiber and a source of pump light said method including selecting the wavelength of the source to lie within a range of 970 nm to 977 nm or 981 nm to 986 nm. More preferably, the method includes selecting the wavelength of the pump source to lie within the range 974 nm to 975 nm or 981 nm to 983 nm. Most preferably, the method includes selecting the wavelength of the pump source to lie in the range of 974.5 nm to 975 nm or 982 nm to 983 nm.

The provision of a method of operating a transmission system having a plurality of optical amplifiers arranged to amplify the signals the wavelengths of which lie in the range 1530 nm to 1565 nm, each optical amplifier comprising an erbium-doped silica fiber and a source of pump light said method including selecting the wavelength of the source to lie within a range 970 nm to 977 nm or 981 nm to 986 nm. More preferably, the method includes selecting the wavelength of the pump source to lie within the range of 974 nm to 976 nm or 981 nm to 984 nm. Most preferably, the method includes selecting the wavelength of the pump source to lie within the range 974 nm to 975 nm or 982 nm to 983 nm.

The provision of a method of operating a transmission system having a plurality of optical amplifiers, each optical amplifier comprising an erbium-doped silica optical fiber and a source of pump light, the method including selecting the wavelength of the source to lie within a 2 nm waveband in the range of 970 nm to 975 nm or 982 nm to 986 nm. More preferably, the method includes selecting the wavelength of the source to lie within a 1 nm waveband in the range of 970 nm to 975 nm or 981 nm to 986 nm. Most preferably, the method includes selecting the wavelength of the source to lie within a 0.5 nm waveband in the range of 970 nm to 976 nm or 981 nm to 986 nm.

The provision of a method of operating a transmission system having a plurality of optical amplifiers arranged to amplify signals, the wavelengths of which lie in the range 1530 nm to 1565 nm, each optical amplifier comprising an erbium-doped silica optical fiber and a source of pump light, the method including selecting the wavelength of the source to lie within a 2 nm waveband in the range of 970 nm to 977 nm or 981 nm to 986 nm. More preferably, the method includes selecting the wavelength of the source to lie within a 1 nm waveband in the range of 970 nm to 977 nm or 981 nm to 986 nm. Most preferably, the method includes selecting the wavelength of the source to lie within a 0.5 nm waveband in the range of 970 nm to 977 nm or 981 nm to 986 nm.

From the foregoing, it will be evident that the objects of the invention include: (1) the provision of improved optical amplifiers for use in lightwave transmission systems, e.g., optical waveguide communications systems; (2) the provision of improved optical amplifiers for use in wavelength division multiplexing systems; (3) the provision of improved optical amplifiers for use with signal wavelengths in the blue band; (4) the provision of improved pumping strategies for optical amplifiers; (5) the provision of improved pump/filter combinations for optical amplifiers; and (6) the provision of improved signal/pump combinations for optical amplifiers.

In particular, the objects of the invention include providing (1) an optical amplifier adapted to operate in accordance with the above described newly discovered effect of pump wavelength on the gain spectrum of an optical amplifier by limiting pump wavelength, and (2) a wave division multiplexed transmission system having a plurality of optical amplifiers which are adapted to operate in accordance with this discovered effect, again by limiting pump wavelength.

BRIEF DESCRIPTION OF THE DRAWINGS

There follows a description of optical amplifiers and wavelength division multiplexed (WDM) transmission systems embodying certain preferred but non-limiting forms of the invention. The description refers to the accompanying drawings in which.

Figure 1A:
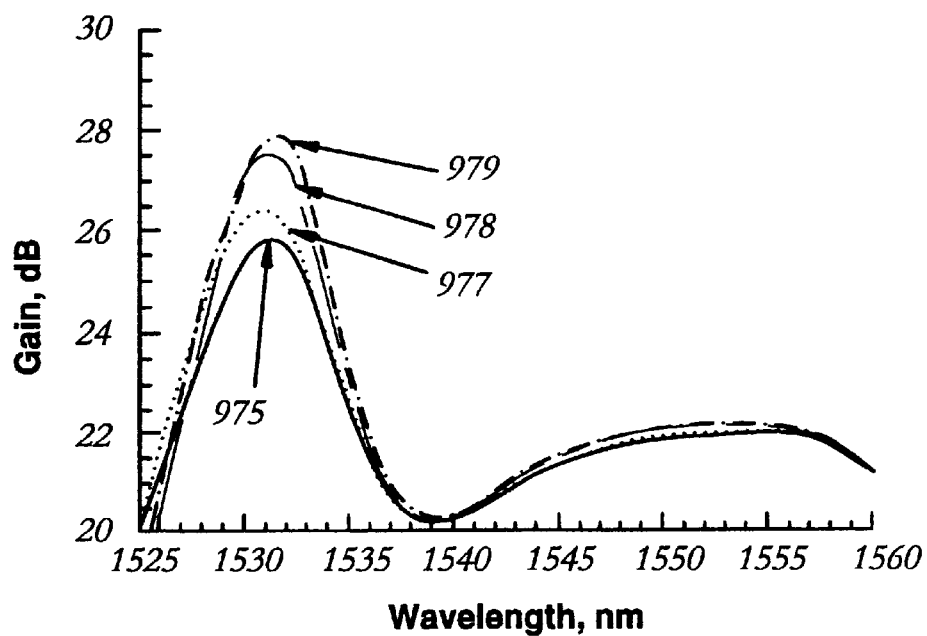
FIGS. 1A and 1B show the variation of the gain spectrum of an erbium doped fiber amplifier with pump wavelength. The curves of these figures are small signal gain spectra obtained in the presence of a saturating signal ($\lambda_{sat}$) which was at 1535 nanometers for FIG. 1A and at 1561 nanometers for FIG. 1B. The spectra were measured using Hewlett-Packard's time domain extinction noise gain measurement technique. The horizontal axis in each of these figures shows wavelength in nanometers, while the vertical axis shows gain in dB's. The solid lines are for a pump wavelength of 975 nm, the dotted lines are for a pump wavelength of 977 nm, the long dash/short dash lines are for a pump wavelength of 978 nm, and the short dash/dotted lines are for a pump wavelength of 979 nm.

The foregoing drawings, which are incorporated in and constitute part of the specification, illustrate the preferred embodiments of the invention, and together with the description, serve to explain the principles of the invention. It is to be understood, of course, that both the drawings and the description are explanatory only and are not restrictive of the invention.

DETAILED DESCRIPTION OF THE INVENTION

I. Optical Amplifiers Employing Pump Wavelength Tuning

As discussed above, the present invention relates to the use of pump wavelength tuning to control the gain spectrum of an optical amplifier.

The invention can be used with a variety of optical amplifier designs. In all cases, the amplifier will include an amplifying medium and a pump, and may optionally include a gain flattening filter. Preferred amplifying media are rare earth doped materials, e.g., erbium doped glasses. The amplifying medium is preferably configured as a waveguide, e.g., as an optical waveguide fiber. The pump is preferably a semiconductor laser operating in the 980 nanometer pump band. The gain flattening filter, when used, can be, for example, an interference filter or a long period grating.

Pump wavelength tuning is most conveniently accomplished by controlling the temperature of the pump using, for example, a thermoelectric cooler employing the Peltier effect. Such coolers are often supplied as part of a commercial semiconductor laser package. In the past, thermoelectric coolers have been used to achieve "gross" wavelength tuning, i.e., they have been used to place the pump wavelength generally within the selected pump band, e.g., the 980 nanometer band. Thermoelectric coolers, however, have not previously been used to achieve fine tuning of the type described herein. Other approaches to wavelength tuning include the use of gratings, including tunable gratings, as part of an external laser cavity. Whatever approach is selected, it should be able to achieve fine pump wavelength control. As discussed above, such control will normally be to within two nanometers, preferably to within one nanometer, and more preferably to within a half a nanometer or less. The level of control required will depend on the sensitivity to pump wavelength of the gain spectrum or portion thereof whose shape is to be controlled through pump wavelength tuning. Control to within 0.25 nanometers is readily achieved with a thermoelectric cooler.

It should be noted that pump wavelength tuning can be practiced either during the design and/or the manufacture of an optical amplifier or in real time as the amplifier is being used. When pump wavelength tuning is used during the design and/or the manufacturing stage, a particular pump wavelength or a set of pump wavelengths is chosen to achieve desired gain spectra for one or more sets of signal wavelengths, signal powers, and pump powers. That chosen pump wavelength or a member of the set of chosen pump wavelengths is then obtained by, for example, selecting the set point temperature of the pump laser. When used in real time, the pump wavelength is set either manually or automatically based on, for example, the current set of signal wavelengths which is to be amplified. It should be further noted that pump wavelength tuning can be used both at the design/manufacturing stage and during real time.

Figure 1B:
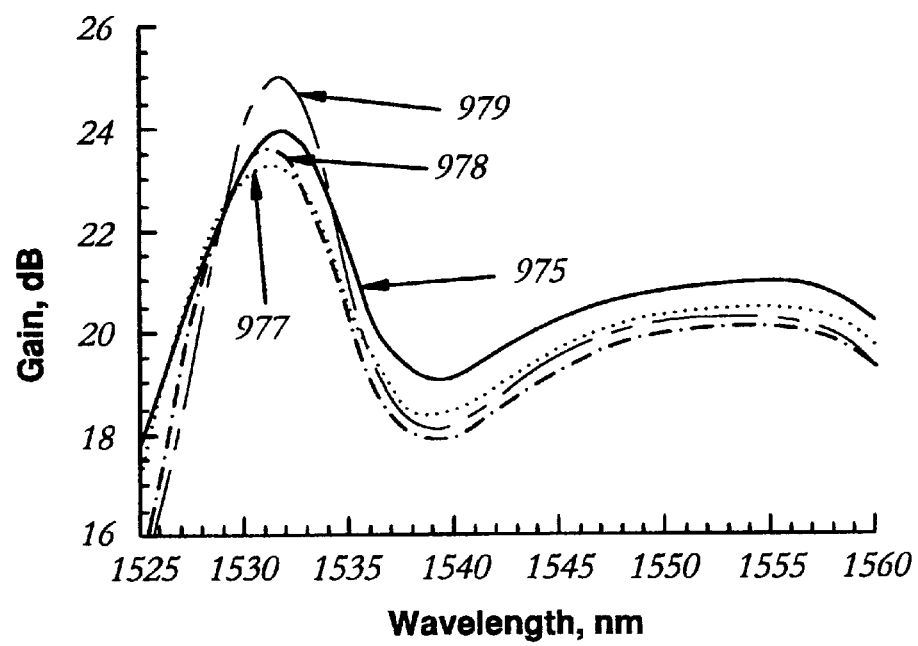

FIGS. 1A and 1B show the variation of the gain spectrum of an erbium doped fiber amplifier with pump wavelength. These figures were prepared by applying a $-16$ dBm signal at 1535 nanometers (FIG. 1A) or 1561 nanometers (FIG. 1B) to a single stage EDFA incorporating a Corning Type II EDF (Corning Incorporated, Corning, N.Y.), which was forward pumped in the 980 band using a semiconductor laser equipped with a thermoelectric cooler which was used to adjust the pump wavelength. The amplifier did not include a gain flattening filter. The output from the amplifier was analyzed using a Hewlett-Packard time domain extinction gain bench. For each pump wavelength, the gain values were equalized to within about 0.15 dB at 1555 nanometers for the FIG. 1A data and at 1529 nanometers for the FIG. 1B data using an attenuator between the pump laser and the erbium doped fiber.

As can be seen in these figures, the gain spectrum in the blue band exhibits substantial variation as a function of pump wavelength, e.g., on the order of 2–3 dB, both for a saturating signal in the blue band (FIG. 1A) and in the red band (FIG. 1B). The variation in the red band of FIG. 1B is due to the gain value equalization at 1529 nanometers, which is one of the most pump wavelength sensitive signal wavelengths. Accordingly, the red band variability of this figure is indicative of gain changes in the blue band, specifically, gain changes at 1529 nanometers, as opposed to gain changes in the red band. Indeed, the gain changes at 1529 nanometers can be directly derived from the nearly parallel curves of the red band of FIG. 1B. Significantly, the homogeneous model would have predicted essentially no spread between the gain spectrum curves of FIGS. 1A and 1B in either the blue or red bands.

On the most basic level, the curves of these figures demonstrate that the gain spectrum of an amplifier can be flattened by pump wavelength tuning. In both figures, the gain spectrum for pumping at 975 nanometers is flatter than the gain spectrum for pumping at 979 nanometers, a difference of only 4 nanometers.

On a more complex level, the fact that the effect of pump wavelength tuning is more pronounced in the blue band than in the red band means that pump wavelength tuning can be used to ameliorate the effects of dynamic gain tilt. As known in the art, dynamic gain tilt is the variation in the shape of the gain spectrum of an optical amplifier as a result of a change in the magnitude of the gain provided by the amplifier at a particular wavelength which may be any wavelength within the amplifier's operating range. This can be seen with reference to FIG. 2A which shows gain ripple as a function of pump wavelength for an EDFA operated at gains of 24dB and 33dB at 1555.7 nm. The 24 dB curve of FIG. 2A (i.e., the curve with squares) was derived from curves of the type shown in FIG. 2B, which shows red band gain spectra for various pump wavelengths between 975 nm and 981 nm. The 33 dB curve of FIG. 2A (i.e., the curve with diamonds) was derived from red band gain spectra (not shown) for a 33dB gain at 1555.7 nm, again for various pump wavelengths in the 980 nm pump band.

Like pump wavelength tuning, dynamic gain tilting is more pronounced in the blue band than the red band. Accordingly, pump wavelength tuning can be used to cancel at least some of the effects of dynamic gain tilting. This cancellation will generally be more complete in the case of a system employing a small number of signal wavelengths, e.g., two wavelengths.

Figure 3:
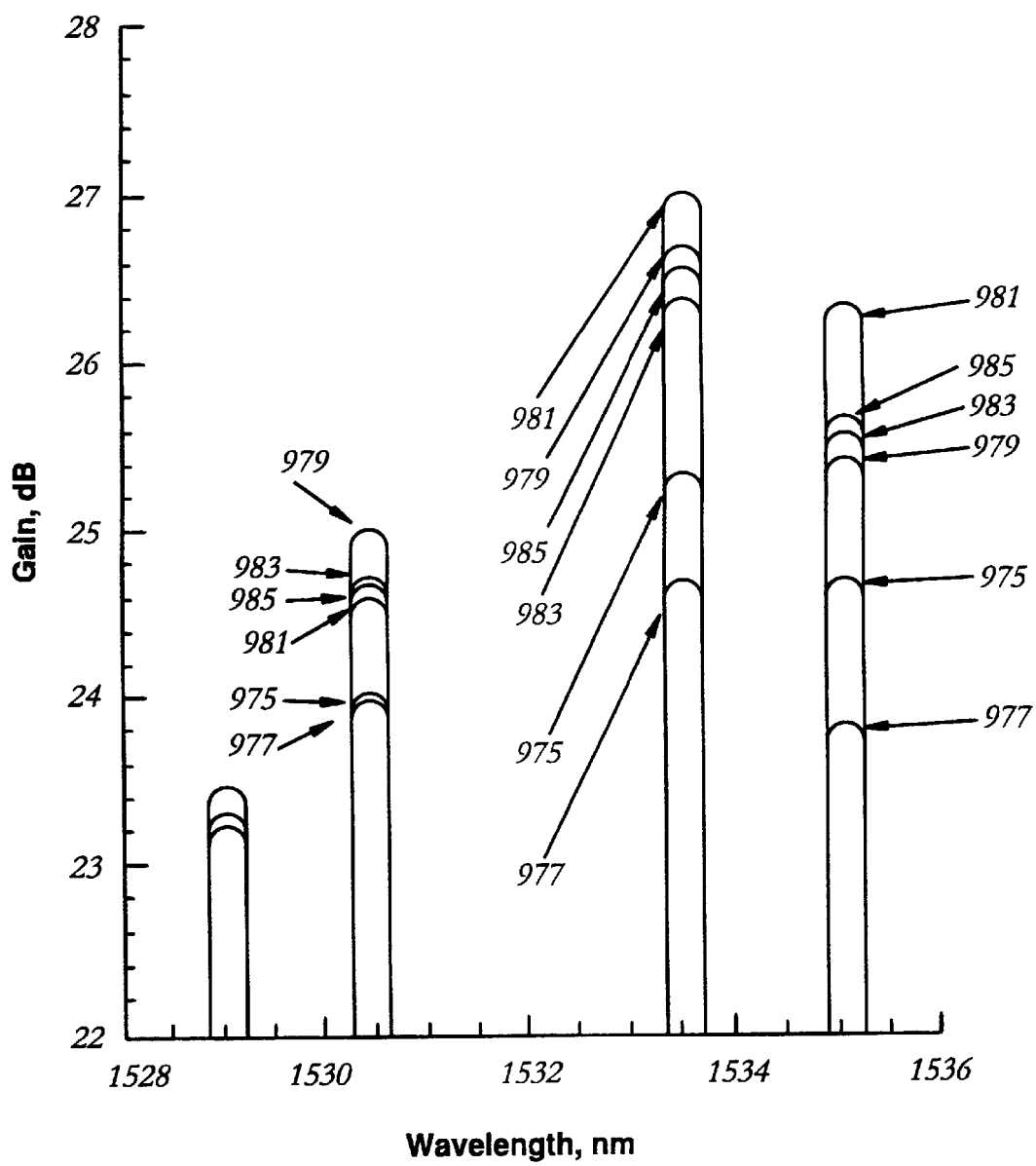
FIG. 3 is a plot of gain at four signal wavelengths of 1529, 1530.3, 1533.5, and 1535.0 nanometers as pump wavelength was varied from 975 nanometers to 985 nanometers. The horizontal axis in this figure shows wavelength in nanometers, while the vertical axis shows gain in dB's.
Figure 4:
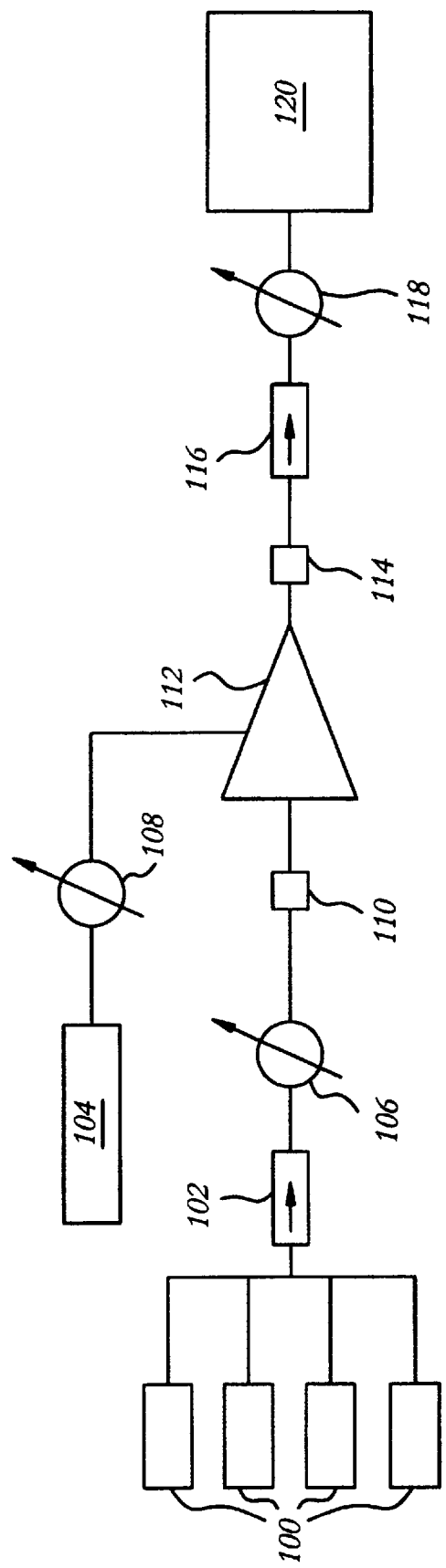
FIG. 4 is a schematic diagram of the apparatus used to generate the data of FIGS. 3, 5, 11, and 12. The reference numbers used in this figure have the following meanings: 100—tunable lasers; 102—isolator; 104—pump; 106—VOA 1; 108—pump VOA; 110—connector; 112—EDFA; 114—connector; 116—isolator; 118—VOA 2; and 120—OSA.

The flattening effect shown in FIG. 1 is further illustrated in FIG. 3. This figure was prepared using the apparatus of FIG. 4. This apparatus comprises four tunable lasers (100) whose wavelengths (the "signal wavelengths") can be adjusted throughout the erbium gain band. The lasers were adjusted to have the same power (to within several hundredths of a dB) as measured by optical spectrum analyzer 120 (OSA) when the amplifier was replaced with a short section of low loss fiber.

The total power incident on the amplifier was controlled with variable optical attenuator 106 (VOA1). To keep the power incident on the OSA relatively constant for all experimental conditions, variable optical attenuator 118 (VOA2) was used to add attenuation equal to the nominal gain of the amplifier. The gain of the amplifier for each of the signal wavelengths was determined using the OSA to measure the VOA2-attenuated output of the amplifier as a function of wavelength. The gain values of FIG. 3 are given by the output power level measured at the OSA plus the attenuation of VOA2 minus the input power, all in dB.

Pump VOA 108 was used to adjust the amount of 980 band pump power delivered to the amplifier without having to adjust the pump drive current and thereby affect the pump wavelength. In particular, the pump power was adjusted so that the gain for the 1529 signal wavelength was kept at the same value to within 0.15 dB as the pump wavelength was varied. As in FIG. 1, the pump wavelength was varied by varying the temperature of the pump laser.

The amplifier used to prepare the curves of FIG. 3 was a two stage amplifier with an intermediate gain flattening filter designed to provide substantially uniform gain from 1528 nanometers to 1542 nanometers.

As shown in FIG. 3, the gain spectrum achieved for a pump wavelength of 977 nanometers is substantially more uniform for the four signal wavelengths than the gain spectrum achieved for a pump wavelength of 981 nanometers. In particular, the gains at the four signal wavelengths are within 1.5 dB for pumping at 977 nanometers, while the spread is more than 3.5 dB for pumping at 981 nanometers. Plainly, for this system, pumping at 977 nanometers is better than pumping at 981 nanometers in terms of obtaining a similar level of amplification for all signal wavelengths. Moreover, as discussed above, this ability to equalize gain through the choice of pump wavelength will become even more important for a cascade of amplifiers.

It should be further noted in FIG. 3 that the effect of varying pump wavelength is highly non-linear. For example, the gain for pumping at 979 nanometers is greater than the gain at 981 nanometers for a signal wavelength of 1530.3 nanometers, while this relationship is reversed at a signal wavelength of 1535.0 nanometers. This richness in the effects of pump tuning means that the shape of the gain spectrum of an optical amplifier can be adjusted to meet a variety of transmission gain problems encountered in practice.

Figure 5:
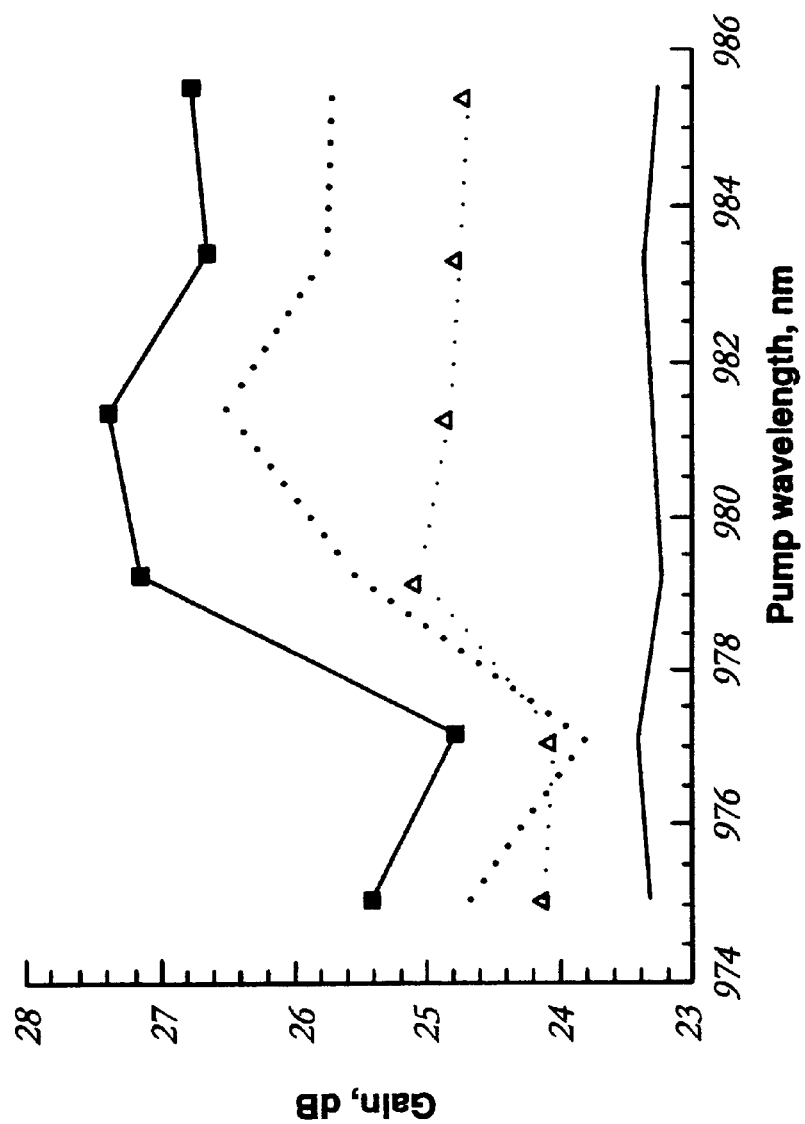
FIG. 5 is a plot of gain versus pump wavelength for four signal wavelengths of 1529 nanometers (solid line), 1530.3 nanometers (dashed line with triangles), 1533.5 nanometers (solid line with squares), and 1535.0 nanometers (dashed line). The data of this figure was obtained using the apparatus of FIG. 4 and an optical amplifier of the type used to generate the data of FIG. 3 as described below. The horizontal axis in this figure shows wavelength in nanometers, while the vertical axis shows gain in dB's.

FIG. 5 replots data of the type shown in FIG. 3 in a format which can more readily be used to select a pump wavelength where the differences in gain among various signal wavelengths is minimized. From this figure, it is evident that operating at a pump wavelength of about 977 nanometers will provide the most uniform gain for the set of signal wavelengths of this figure.

Similar plots can be prepared for other amplifier designs and used to select an optimum pump wavelength for any desired set of signal wavelengths and any desired relationship between input and output power levels. Along the same lines, plots of the type shown in FIG. 5 can be prepared for different pump power levels. Also, the effects of amplified spontaneous emission (ASE), e.g., ASE from the amplifier being optimized and/or from a prior or subsequent amplifier in a cascaded series of amplifiers, can be included in selecting the pump wavelength by treating ASE as an additional set of input signals to the amplifier.

Figure 6:
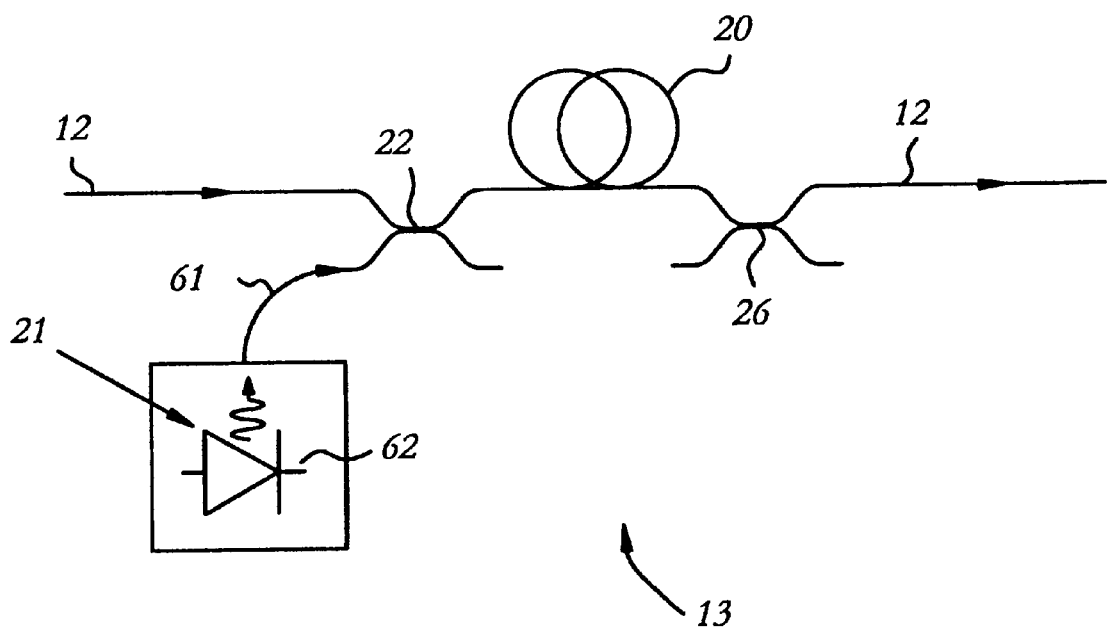
FIG. 6 schematically represents an optical amplifier to which pump wavelength tuning may be applied.

FIG. 6 depicts an amplifier 13 having a length of erbium-doped optical fiber 20 which is coupled through a connector 22 to the fiber 12. A light source 21 is included to produce pump light which is transmitted along a fiber 61 and through the coupler 22 to pump the erbium-doped optical fiber 20. The pump source 21 is in the form of a diode-laser 62 which is selected to have a wavelength in accordance with the present invention.

The erbium-doped optical fiber 20 is connected at its output end through a connector 26 to optical fiber 12. The means of selecting the wavelength of the diode-laser pump will now be described with reference to FIGS. 7 and 8.

Figure 7:
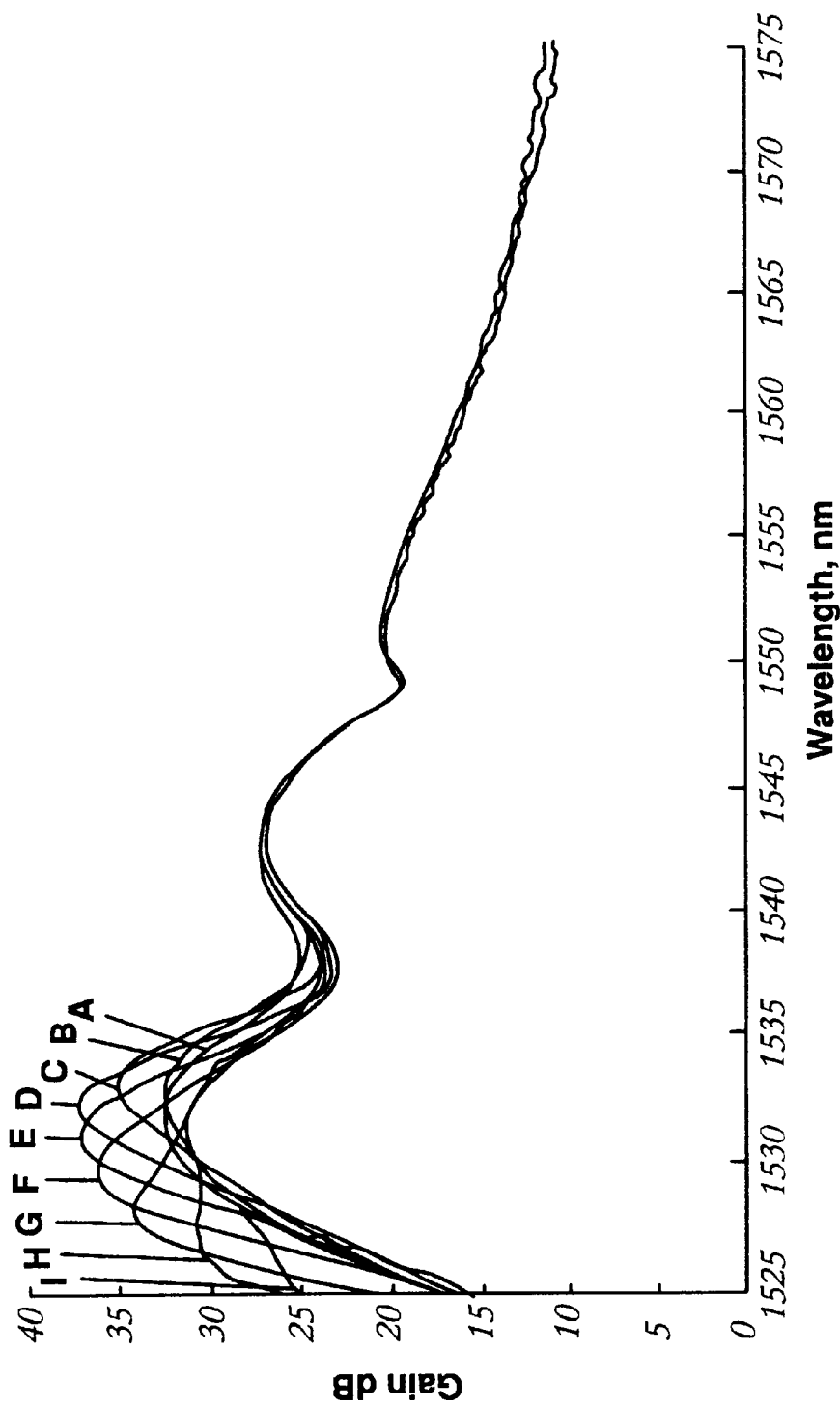
FIG. 7 graphically represents the gain of a liquid nitrogen cooled erbium-doped fiber (EDF) over the range 1525 nm to 1575 nm, when pumped with a plurality of different pump wavelengths. The horizontal axis in this figure shows wavelength in nanometers, while the vertical axis shows gain in dB's. The pump wavelengths for the various curves of this figure are as follows: A—981.7 nm; B—980.9 nm; C—980.1 nm; D—979.15 nm; E—978.2 nm; F—977.45 nm; G—976.7 nm; H—975.9 nm; I—975.1 nm.

FIG. 7 clearly illustrates the result that the gain spectrum of an optical amplifier in the 1.5 $\mu$m range, when pumped in the 980 nm absorption band, has a dependence on the specific wavelength of the pump laser. This dependence is unexpected from the conventional theory of the operation of erbium-doped fiber amplifiers. The absorption band for the erbium-doped fiber spreads from approximately 974 nm to 986 nm. Normally, approximately 980 nm pump laser-diodes are manufactured so as to lase at a wavelength within a spread of center wavelengths around the absorption peak of approximately 979 nm.

In particular, signal wavelengths between 1528 nm and 1540 nm (blue band) have a larger unexpected variation in gain (gain ripple), whereas wavelengths in the above 1540 nm (red band) have a much lesser differential gain. It can also been seen from FIG. 7 that the wavelength dependent portion of the gain spectrum moves from short wavelength to long wavelength as the pump wavelength increases.

Figure 8:
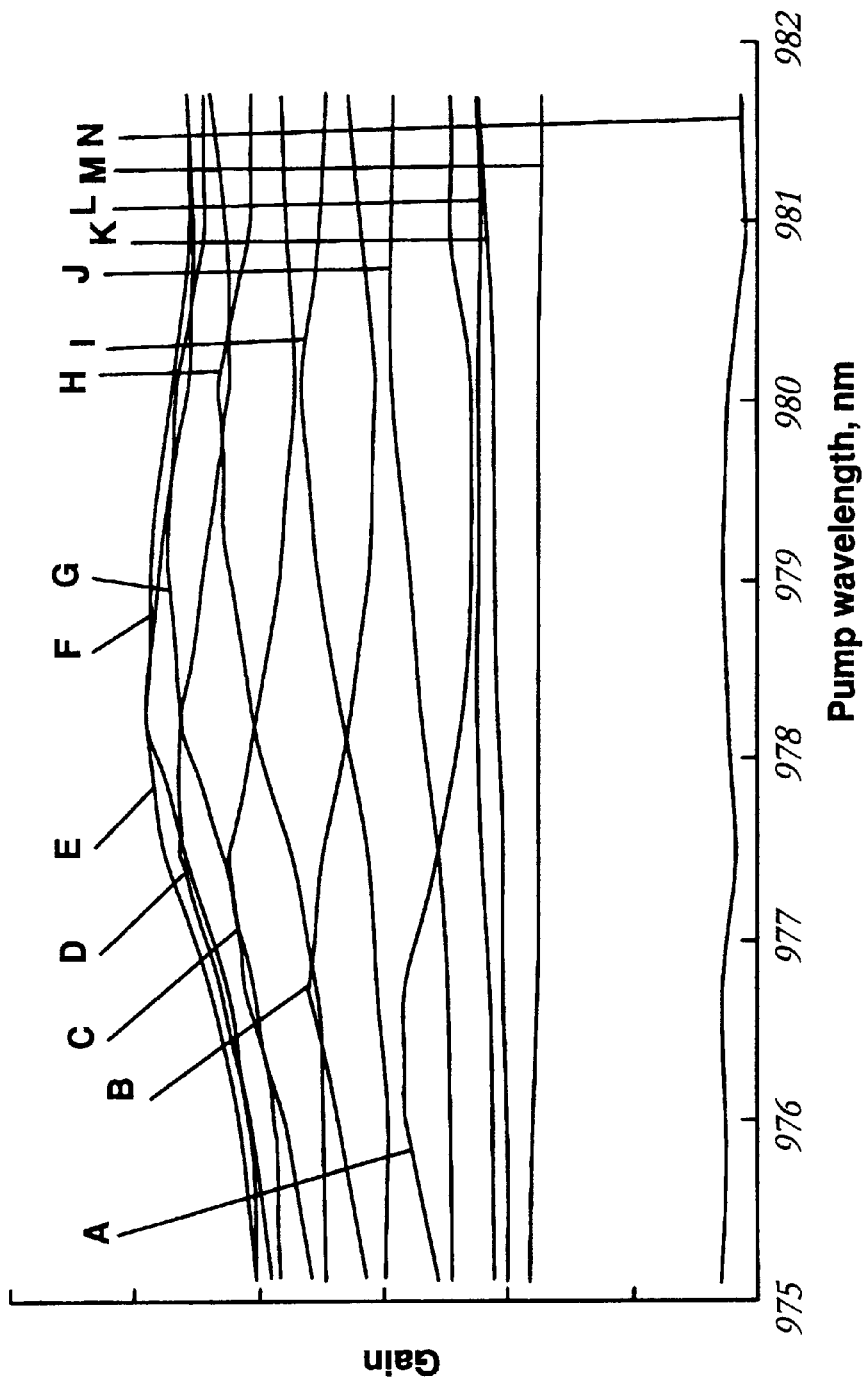
FIG. 8 represents gain in an erbium-doped fiber amplifier at different signal wavelengths, over a range of pump wavelengths. The horizontal axis in this figure shows pump wavelength in nanometers, while the vertical axis shows gain. The signal wavelengths for the various curves of this figure are as follows: A—1526.96 nm; B—1528.02 nm; C—1529.07 nm; D—1530.13 nm; E—1531.18 nm; F—1532.24 nm; G—1532.94 nm; H—1533.99 nm; I—1535.05 nm; J—1536.11 nm; K—1539.97 nm; L—1550.18 nm; M—1560.03 nm; N—1565.30 nm.
Figure 9:
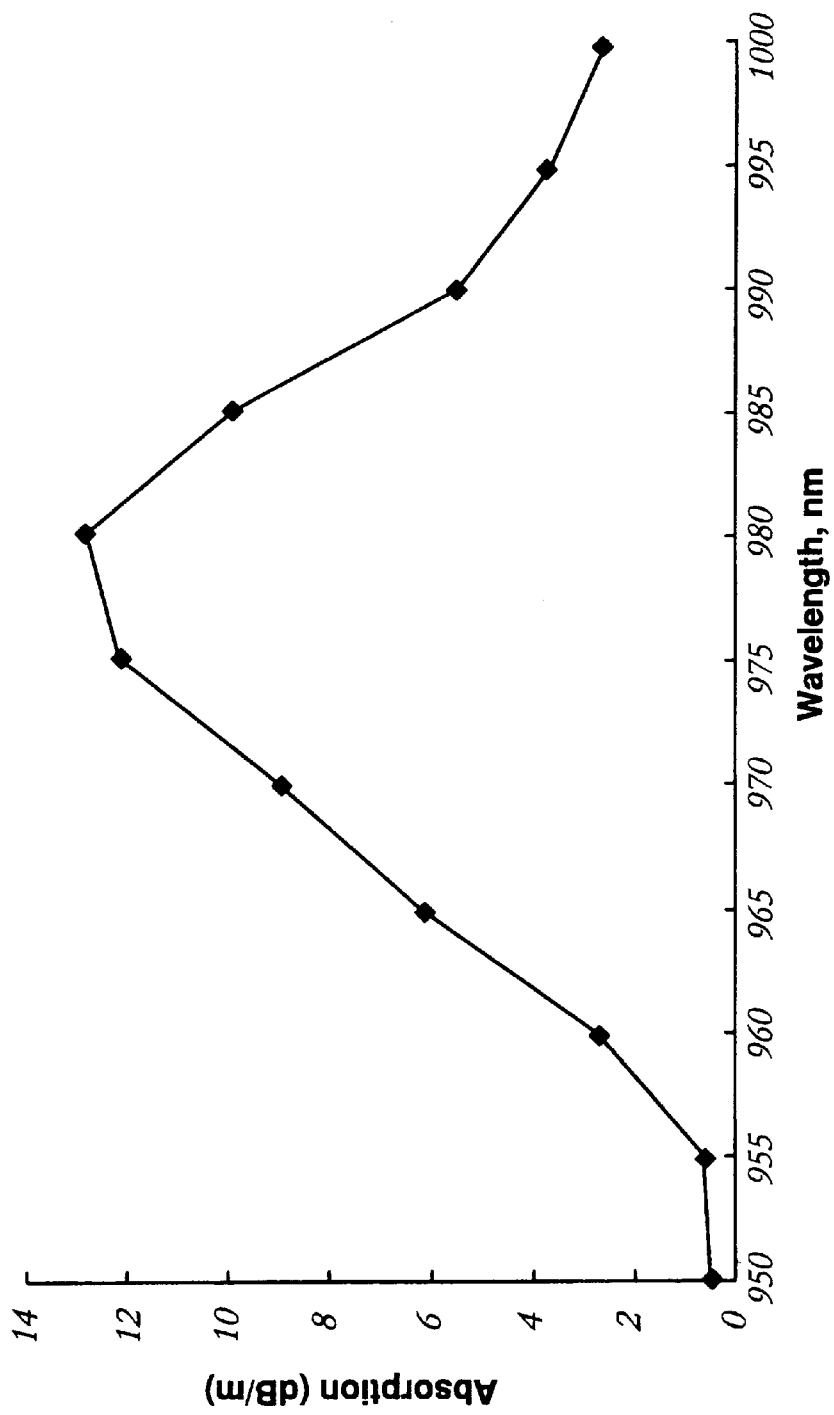
FIG. 9 graphically illustrates pump absorption versus wavelength of an erbium-doped fiber amplifier in the 980 nm wavelength range. The horizontal axis in this figure shows pump wavelength in nanometers, while the vertical axis shows absorption in dB/meter.

In addition, FIG. 8 illustrates the effect of pump wavelength on gain at different signal wavelengths throughout the pump wavelength spectrum (975 nm to 982 nm). This figure also illustrates clearly the fact that as pump wavelength increases towards the absorption peak the differential gain increases. Therefore, in complete contrast to previous selection criteria, it is clear that laser-diodes which emit in the wavelength range adjacent 979 nm, and in particular in the bandwidth from 977 nm to 981 nm are not desirable as pump sources despite their good absorption. Tables 1 and 2 illustrate this effect numerically.

As can be seen from Table 1, the effect provides an increasingly good result with reduced ripple i.e. more uniform gain in all signal channels, the further the pump wavelength is moved from the absorption peak. Since the change in ripple as a function of the change in pump wavelength is greatest at the absorption peak, better control can in general be achieved when the pump wavelength is not at the absorption peak.

As can be seen from Table 2 it is also preferable to have a pump wavelength within a very small window, thus preventing the additional gain ripple effect due to pump wavelength dependence. If this wavelength window is as small as 0.5 nm then the edge of the allowed range can be moved closer to the absorption peak. In addition, it is clear that the effect is greater at lower signal wavelengths. Therefore, if you wish to have signals in the range 1528 nm and above then the selection of the pump wavelength is more critical and the disallowed range should be larger, especially in the lower wavelength pump band. Therefore, on reviewing Table 2 it is clear that if a 2 nm window in pump wavelength is to be used for a 1528 nm and above signal the 2 nm window must be within a range of 970 nm to 975 nm or 982 nm to 986 nm, whereas if the signal is in the 1530 nm and above wavelength range, the window may fall in the range 970 nm to 977 nm or 981 nm to 986 nm. Likewise, if you have 1 nm window and a signal in the 1528 nm and above range, the allowed window must lie within the range 970 nm to 975 nm or 981 nm to 986 nm range. Finally, if you have a 0.5 nm window and a signal in the 1528 nm range the window must lie within the 970 nm range to 976 nm or 981 nm to 986 nm. Clearly, if you are reducing the size of the allowed window the edge of that window can be pushed further towards the absorption peak.

Also, it is the edge of the allowed band(s) adjacent the absorption peak which is significant, the edge of the band(s) remote from the peak being determined in part by the absorption bandwidth of the erbium doped fiber in the 980 nm range.

It would be clear to a person skilled in the art that you wish to operate as close to the absorption peak as possible to minimize the length of erbium-doped fiber required to amplify a signal to a particular gain. However, this advantage is more than outweighed by the increased differential gain provided by use of pump wavelengths in the aforementioned disallowed ranges.

Figure 10:
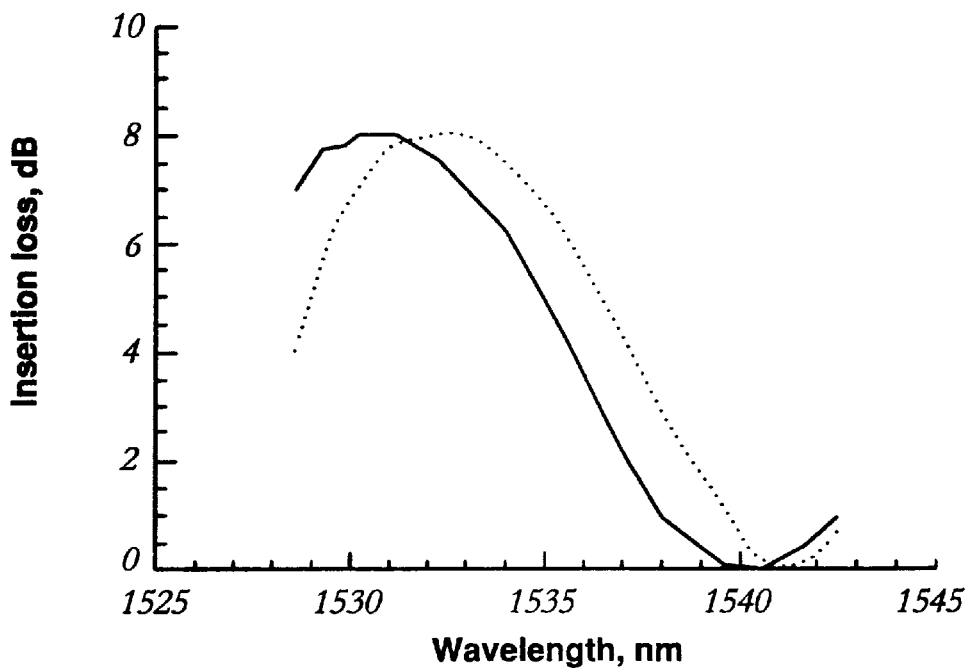
FIG. 10 is a plot of the wavelength dependent component of the passive loss of two gain modules. The horizontal axis in this figure shows wavelength in nanometers, while the vertical axis shows insertion loss in dB's. The solid line shows insertion losses for a first module "N" and the dotted line shows insert losses for a second module "L."
Figure 11:
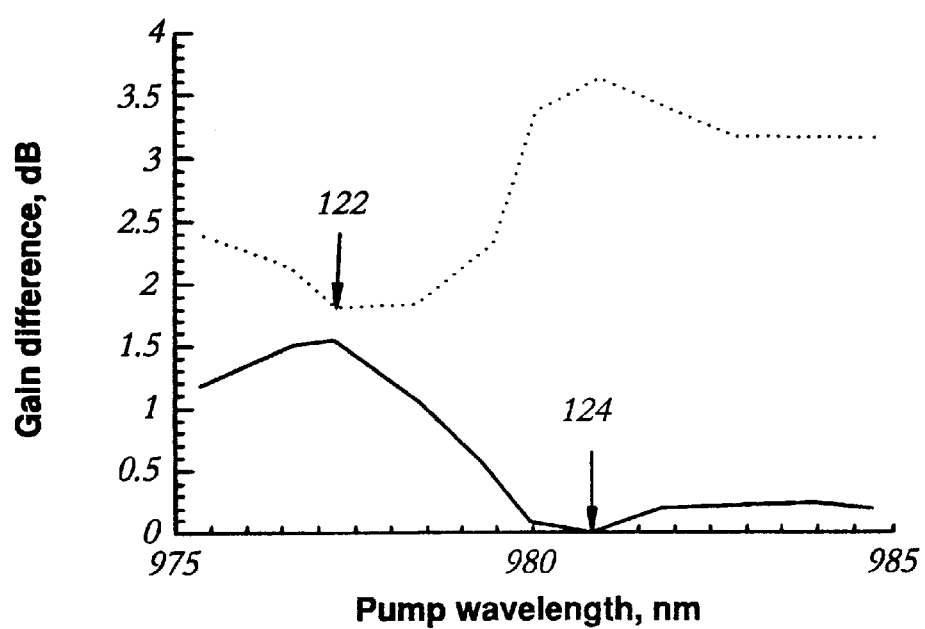
FIG. 11 illustrates the application of the invention to reduce the effects on amplifier performance of the differences in the wavelength dependent component of the passive loss of the two gain modules of FIG. 10. The horizontal axis in this figure shows wavelength in nanometers, while the vertical axis shows gain difference in dB's. The solid line shows the gain differences for module "L" and the dotted line shows gain differences for module "N." Arrows 122 and 124 show the optimum pump wavelengths for modules "N" and "L", respectively.

FIGS. 10 and 11 illustrate another application of pump wavelength tuning, namely, its use in optimizing the performance of gain flattening filters. The manufacture of gain flattening filters inevitably leads to some level of variability in the filter's spectral properties, including variations in the shape of the filter's attenuation spectrum and the wavelength of its maximum attenuation. Because the gain spectrum of an amplifier can be changed by pump wavelength tuning, especially in the blue band where gain flattening is most important, one can use the pump wavelength to compensate for filter variability.

FIG. 10 shows the wavelength dependent component of the passive insertion loss of two optical amplifiers (modules) from which the erbium doped fibers (EDFs) were removed and replaced with a low loss fusion splice. The two modules contained different gain flattening filters. As shown in FIG. 10, the loss of module L (dotted line) is spectrally shifted to longer wavelengths compared to the loss of module N (solid line).

FIG. 11 shows the ripple (difference in gain between two test wavelengths) of the two gain modules (EDFs reinstalled) as a function of pump wavelength. In both cases, the test wavelengths were 1529 and 1535.4 nanometers, and the gain was measured for total input powers of −12 dBm. As can be seen in this figure, the optimum pump wavelength for module N (dotted line) with a gain flattening filter peaking at shorter wavelengths, is approximately 977 nanometers (see reference number 122). For module L (solid line), on the other hand, the optimum pump wavelength is approximately 981 nanometers (see reference number 124) since the gain flattening filter of this module has a peak attenuation at longer wavelengths. Operating both modules at a fixed pump wavelength would clearly lead to a significant performance penalty for one or both modules. Tuning the pump wavelength to its optimum value eliminates this deficiency.

The attenuation peak of a gain flattening filter will also change with temperature. The variation in peak attenuation can be compensated for by pump wavelength control, as is evident from FIG. 1B.

Like filters, the operating wavelength range of semiconductor lasers varies from sample to sample as a result of manufacturing variations. Accordingly, the optimization procedure of FIG. 11 may not be achievable for a particular pump/filter combination, e.g., it may not be possible to move the pump wavelength of a particular pump to the value required by a particular filter. In a manufacturing setting, this problem can be addressed by classifying pumps and filters prior to their incorporation into a amplifier so that combinations for which compensation is difficult or impossible to achieve do not occur or only occur with a low frequency. In this way, reject levels can be reduced.

In an aspect of this embodiment of the invention, the impact of manufacturing variations of pump wavelength on the gain spectrum is addressed, e.g., by segregating the manufacturing wavelength distribution into two groups, i.e., long and short pump wavelength groups such as >978 nm and <978 nm, respectively, and delivering one pump from each group to either a double pumped single Er coil or to two coils. Two pump lasers can be connected to a single EDF by pumping it counter-directionally. Preferably, the output from two pumps at different wavelengths are mixed through a 3 dB coupler, and the power is then delivered to one or two coils similarly.

FIG. 5 above illustrates the application of the invention to a single set of signal wavelengths. Users of optical amplifiers may desire to use a particular amplifier with multiple sets of signal wavelengths. In such a case, amplifier performance can be optimized by changing the pump wavelength as the set of signal wavelengths is changed. Alternatively, a compromise pump wavelength can be chosen which, although not optimum for all or any of the sets of signal wavelengths with which the amplifier is to be used, provides adequate performance for those sets without the need for in-the-field adjustment.

Figure 12:
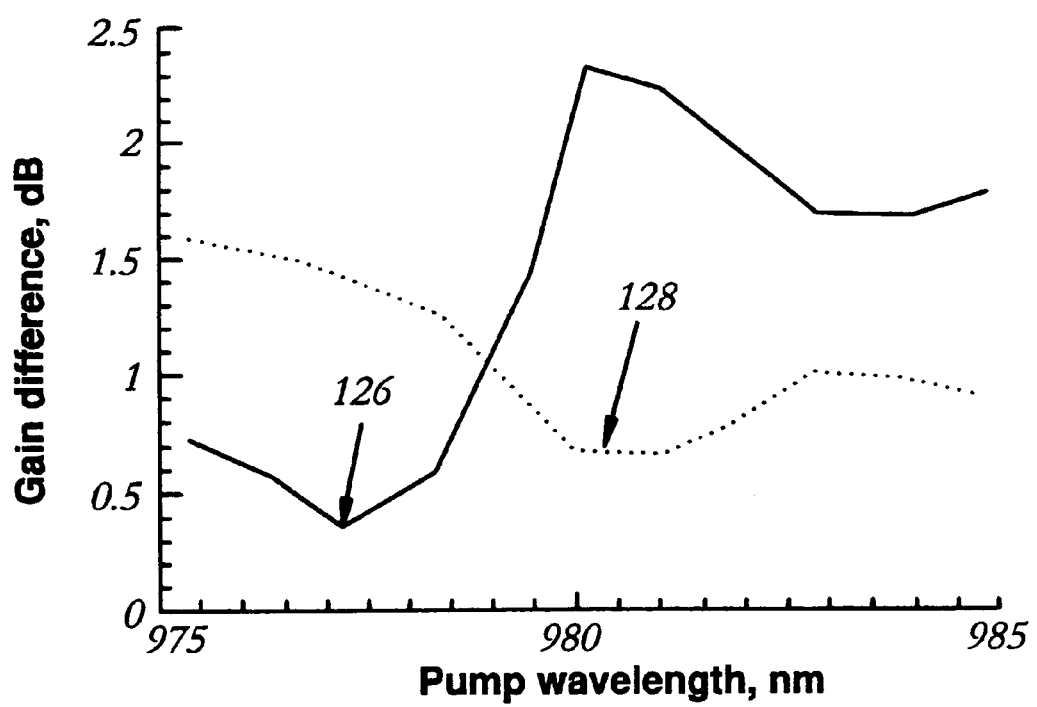
FIG. 12 illustrates the application of the invention to multiple sets of signal wavelengths where each set includes two signal wavelengths. The horizontal axis in this figure shows wavelength in nanometers, while the vertical axis shows gain difference in dB's. The solid line shows the gain differences for signal wavelengths of 1529 and 1533 nm, and the dotted line shows gain differences for signal wavelengths of 1535.4 and 1541 nm. Arrows 126 and 128 show the optimum pump wavelengths for the 1529/1533 and 1535.4/1541 combinations, respectively.

These applications of the invention are illustrated in FIG. 12. The data of this figure was obtained using the apparatus of FIG. 4 but with only two signal lasers operating at a time. The total signal power delivered to the amplifier was −11 dBm for both sets of wavelengths. The signal ripple plotted in this figure is the difference between the measured gains at the two test wavelengths.

For the case where the signals were at 1529 and 1533 nanometers (solid line), the pump wavelength yielding the lowest ripple is approximately 977 nanometers (see reference number 126). The minimum ripple for the 1535.4/1541 nanometer case (dotted line), on the other hand, is approximately 980.5 nanometers (see reference number 128). Accordingly, to obtain optimum amplifier performance, in-the-field adjustments of the pump wavelength can be made as the signal wavelengths applied to the amplifier change. Alternatively, the pump wavelength can be set at a compromise wavelength of about 979 nanometers which provides performance not too far from the optimum for both sets of wavelengths.

Figure 2A:
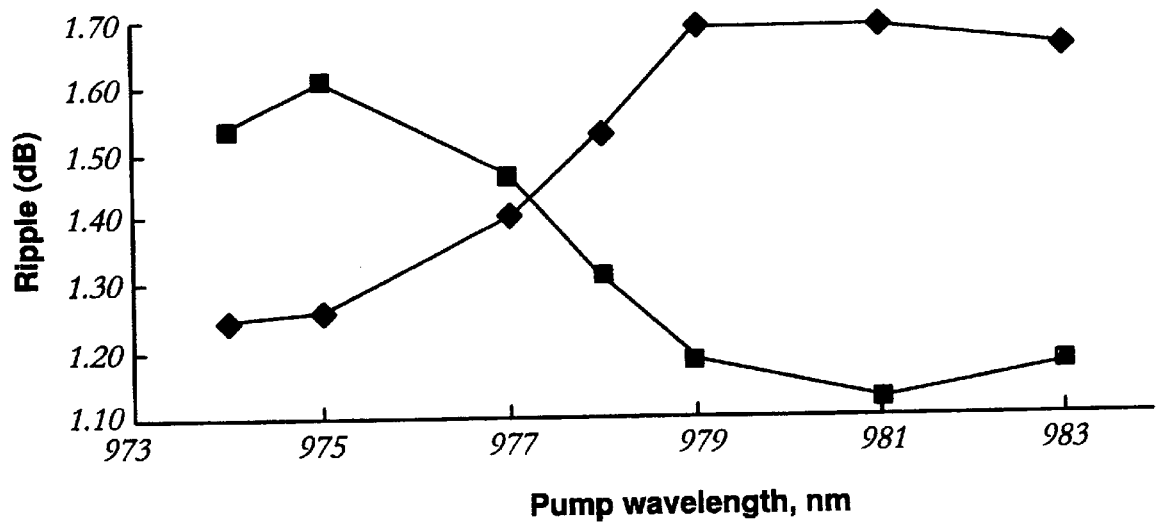
FIG. 2A illustrates the presence of dynamic gain tilt and the application of the invention to improve peak to peak gain ripple over a red band of an EDFA operated at different gains for a given signal wavelength. The horizontal axis in this figure shows wavelength in nanometers, while the vertical axis shows ripple in dB's. The curve with squares is for a gain of 24 dB, while that with diamonds is for a gain of 33 dB.
Figure 2B:
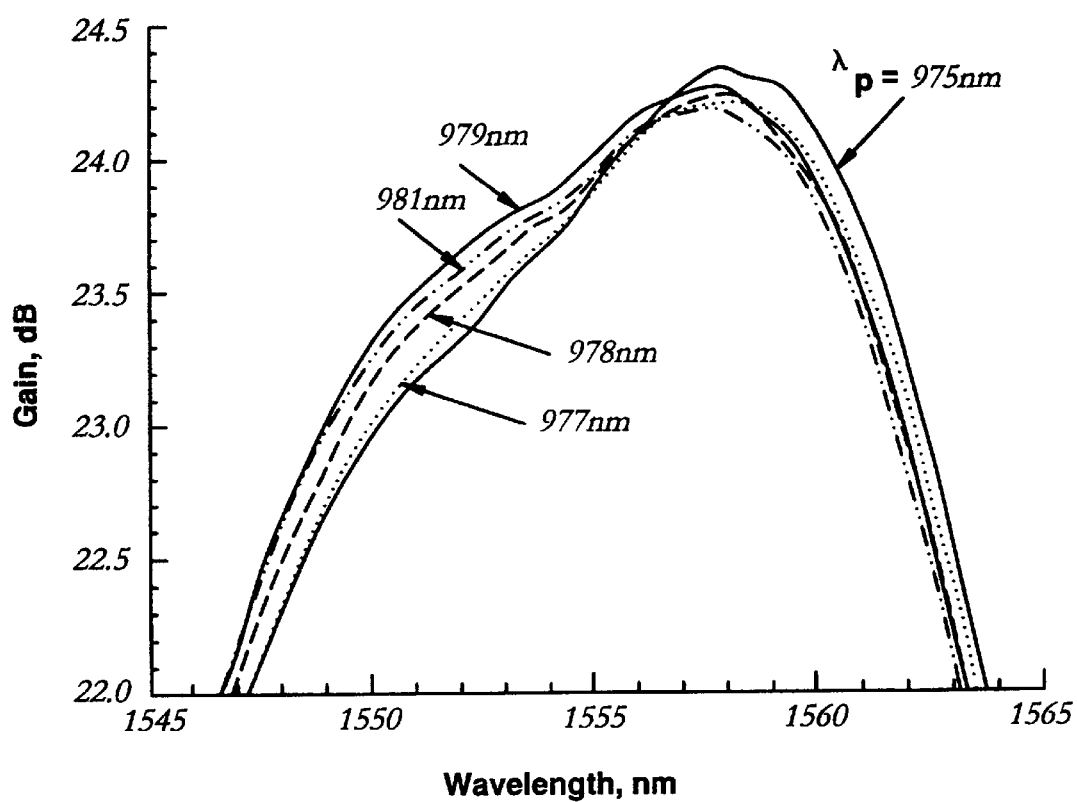
FIG. 2B shows the gain spectrum of a red band EDFA for a series of pump wavelengths ($\lambda_p$) between 975 nm and 981 nm. The horizontal axis in this figure shows wavelength in nanometers, while the vertical axis shows gain in dB's. For each curve, the gain at 1555.7 nm was approximately 24 dB.

Similarly, as seen in FIG. 2A for a red band amplifier, gain ripple for two different gain settings for a single wavelength of 1555.7 nm can be minimized by pump wavelength control.

In addition to tuning the pump wavelength for an optical amplifying medium pumped with a single pump, pump wavelength tuning can also be used in connection with the pumping of an amplifying medium by multiple pumps. For example, if "n" wavelengths are to be amplified, "n−1" pumps can be used, with the pump wavelengths of all the pumps being chosen to optimize the shape of the gain spectrum for all "n" wavelengths. Alternatively, less pumps may be used to achieve a compromise level of optimization. For a discussion of the use of multiple pumps to increase net pump power and provide redundancy see C R Giles, et al., "Simultaneous wavelength-stabilization of 980-nm pump lasers", *IEEE Phot Tech Let,* vol. 6, pp. 907–909, 1994.

II. WDM Transmission Systems Employing Pump Wavelength Tuning

Figure 13:
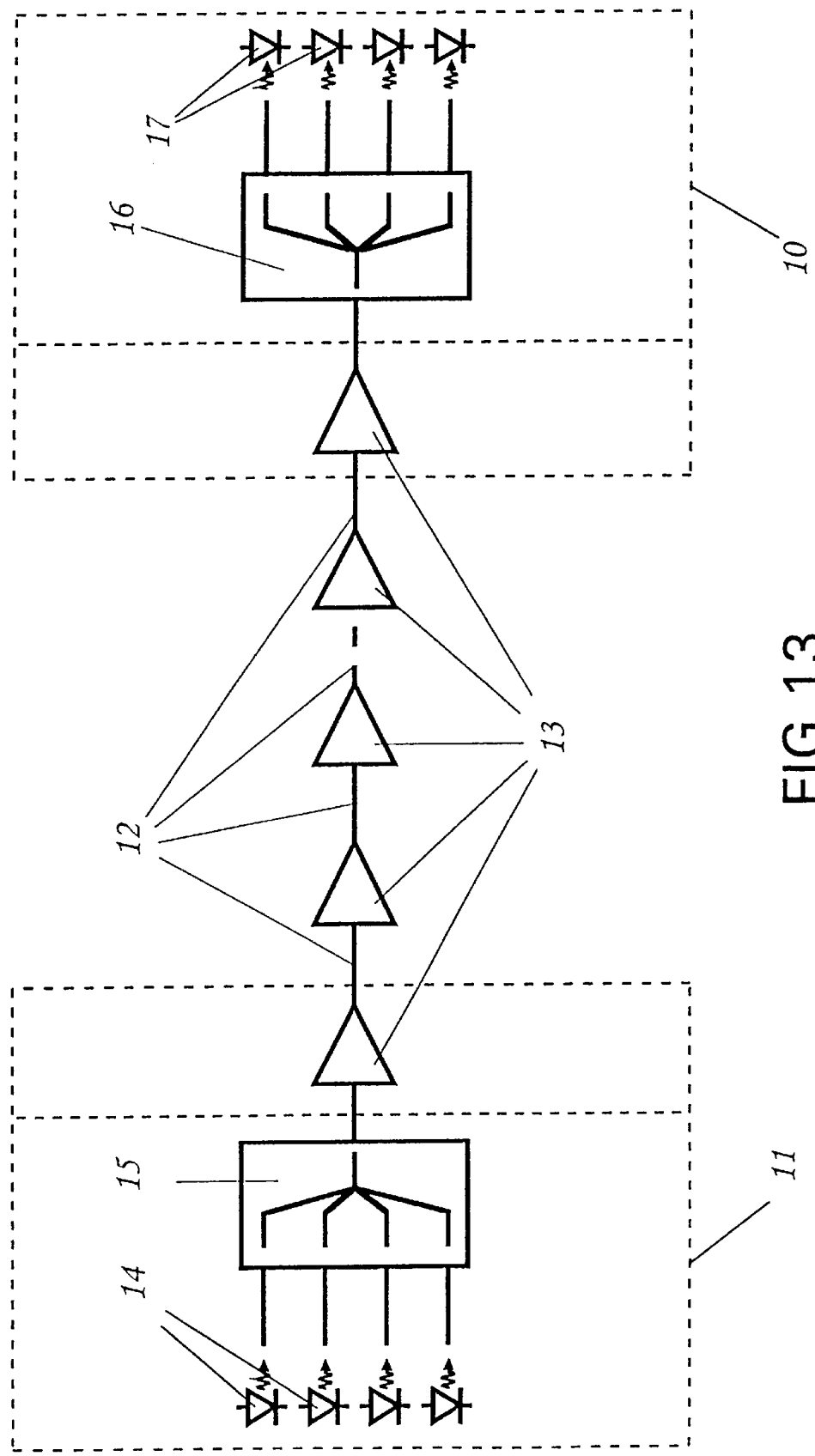
FIG. 13 schematically depicts a WDM transmission system having a receiver connected with a transmitter via a transmission path including a concatenation (plurality) of optical amplifiers, FIGS. 14, 15, and 16 schematically depict alternative forms of optical amplifier for use in the system of FIG. 13.

Referring to FIG. 13, a WDM receiver indicated generally at 10 is optically coupled with a WDM transmitter indicated generally at 11 by means of transmission path 12, in the form of an optical fiber, that includes a concatenation of optical amplifiers 13, spaced along the fiber to amplify signals transmitted between the transmitter 11 and the receiver 10.

The transmitter 11 has a plurality of data-modulated sources 14 (for convenience of illustration only four such sources are indicated in the figure) operating at different wavelengths, typically wavelengths in the waveband extending from about 1525 nm to 1570 nm. Also for simplicity, the invention is described in terms of a receiver and transmitter, whereas of course a pair of transceivers could be used.

These wavelengths are multiplexed on to the common transmission path 12 by means of a wavelength multiplexer 15. Optionally, the transmitter may include one of the concatenation of amplifiers 13. The receiver has a wavelength demultiplexer 16, the counterpart to the multiplexer 15 of the transmitter. The outputs of the demultiplexer 16 feed the individual demultiplexed signal channels to associated detectors 17. The receiver may similarly include one of the concatenation of amplifiers 13 as a preamplifier located upstream of the demultiplexer.

Each of the amplifiers 13 preferably includes a laser diode pumped amplifying medium whose laser diode has its temperature dynamically regulated at least in part by a signal derived from a measured operating parameter of the amplifier or of the system.

Figure 14:
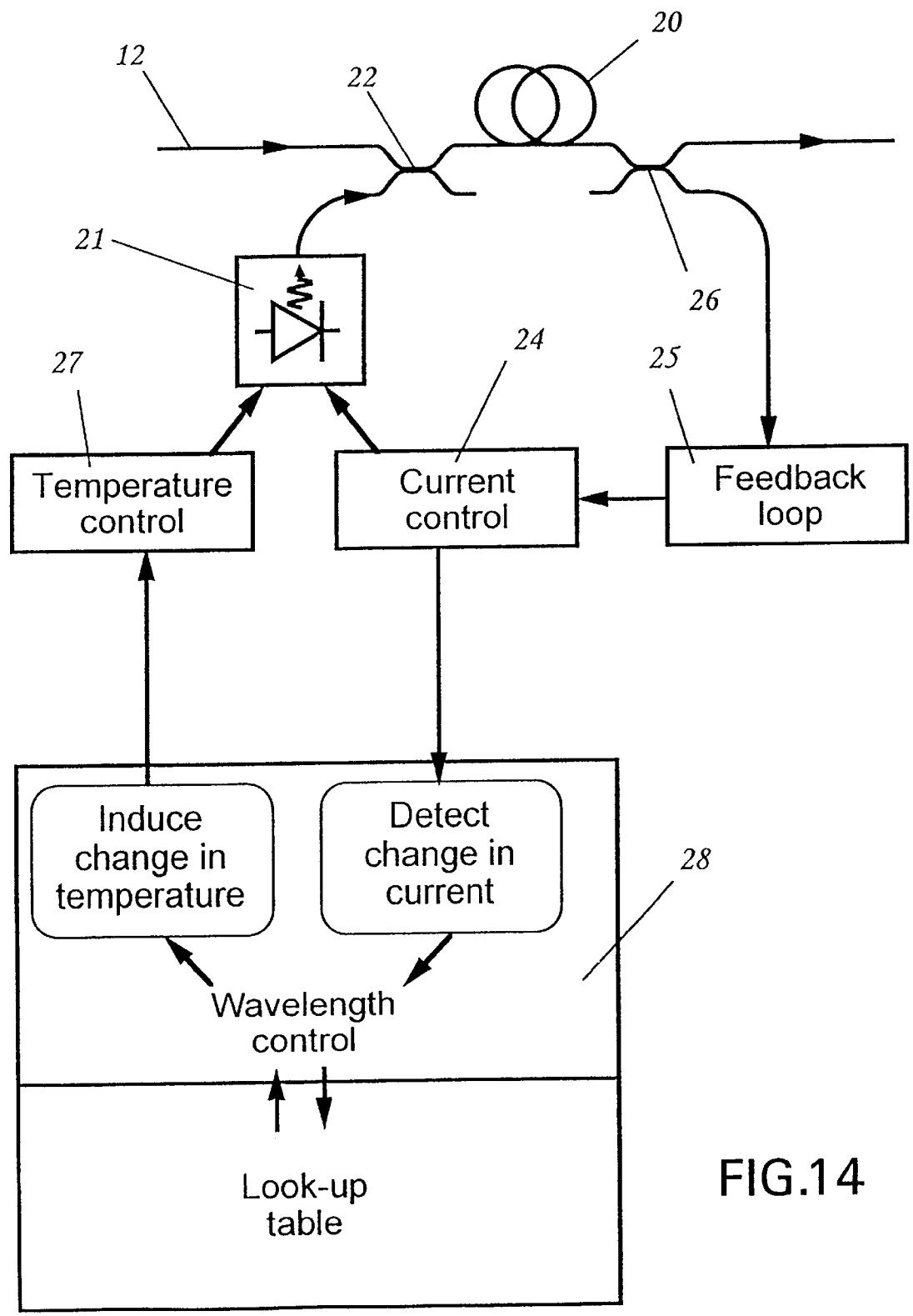

FIG. 14 depicts an amplifier 13 in which this measured operating parameter is the pump laser diode drive current. The amplifier has an optically waveguiding amplifying medium 20. Typically this is constituted by a length of erbium doped optical fiber. The amplifying medium is optically pumped by means of a diode laser pump source 21, typically a source emitting at a wavelength of approximately 980 nm. The output of the source 21 is coupled into the common transmission path by means of a wavelength multiplexing coupler 22. The overall gain of the amplifying medium 20 is stabilized by controlling the drive current applied to the pump laser diode.

The drive current for the laser diode of the pump 21 is supplied by a current controller 24 regulated by a control signal from a feedback loop 25 that derives its error signal from an optical coupler 26 that taps a small proportion of optical power from the output of the amplifier. The laser diode of pump 21 is temperature regulated, for instance by means of Peltier cooler. The regulation is provided by a temperature controller 27 driven by a wavelength control unit 28. The wavelength control unit 28 receives an input from the current controller 24 that provides the pump laser diode drive current, and employs stored data to determine the value of laser diode temperature that is required for this value of drive current in order for the laser diode to emit at a specific wavelength. The data may be stored in the form of a look-up table whose values are obtained prior to installation by plotting the emission wavelength of the laser diode as a function of drive current for different values of laser diode temperature. An alternative way of obtaining these values is to use a reduced number of measurement points and interpolate for the required operating point.

The amplifier of FIG. 14 uses the pump laser diode drive current as the regulating parameter for control of the laser temperature. A drawback of this approach is that it inherently assumes that the relationship between emission wavelength, drive current and temperature does not change as the laser ages. This problem is better addressed by the amplifier of FIG. 15.

Figure 15:
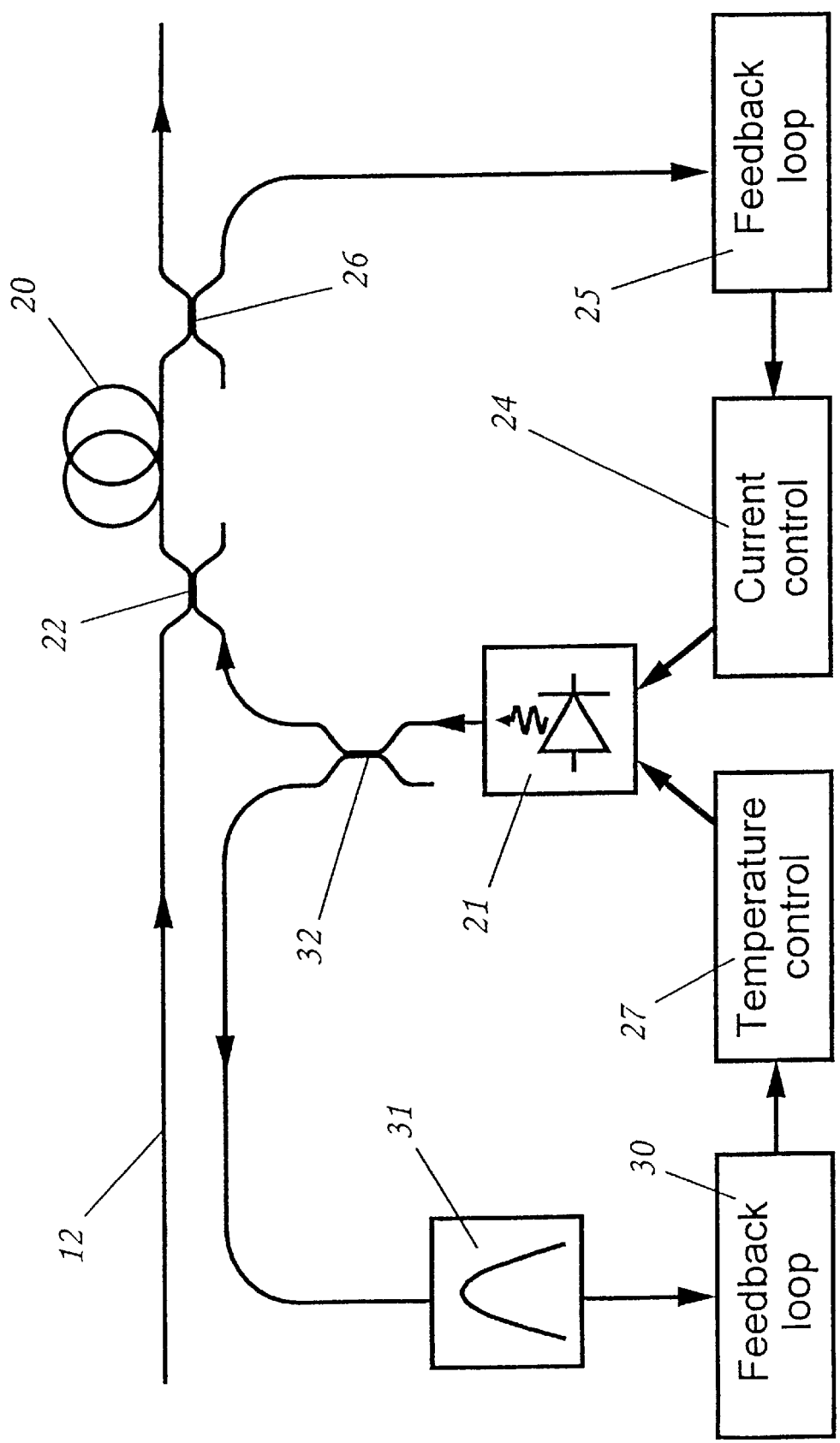

The amplifier of FIG. 15 has many components in common with the amplifier of FIG. 14, and these components are identified in FIG. 15 with the same index numerals as those employed in respect of their counterparts in FIG. 14. The difference between the two amplifiers comprises the replacement of the wavelength control unit 28 of FIG. 14 by a second feedback loop 30 which controls the operation of the temperature controller 27 and derives its error signal from the output of an optical wavelength discriminator 31 applied with an input from an optical coupler 32 that taps a small proportion of optical power supplied to the wavelength multiplexing coupler 22 from the pump 21. Instead of using an optical coupler 32 to tap power emitted from the front facet of the laser diode, the input to the discriminator 31 can be taken from power emitted from the rear facet. The optical wavelength discriminator 31 may, for instance, be constructed in known manner from a parallel arrangement of two Mach Zehnders. One of these is constructed to have a falling edge of its characteristic centered at the desired emission wavelength, while the other Mach Zehnder is constructed to have a rising edge centered at that wavelength.

The amplifier of FIG. 15 operates to stabilize the wavelength emission of its pump laser diode. In this way changes in gain spectrum attributable to changes in pump wavelength are suppressed. A primary reason for desiring stability in the gain spectrum is to enable measures to be taken to avoid signal to noise ratio problems that arise if the power levels of signals launched into different channels of a WDM transmission system are allowed to become increasingly disparate as those signals are amplified by successive amplifiers in the transmission path.

Figure 16:
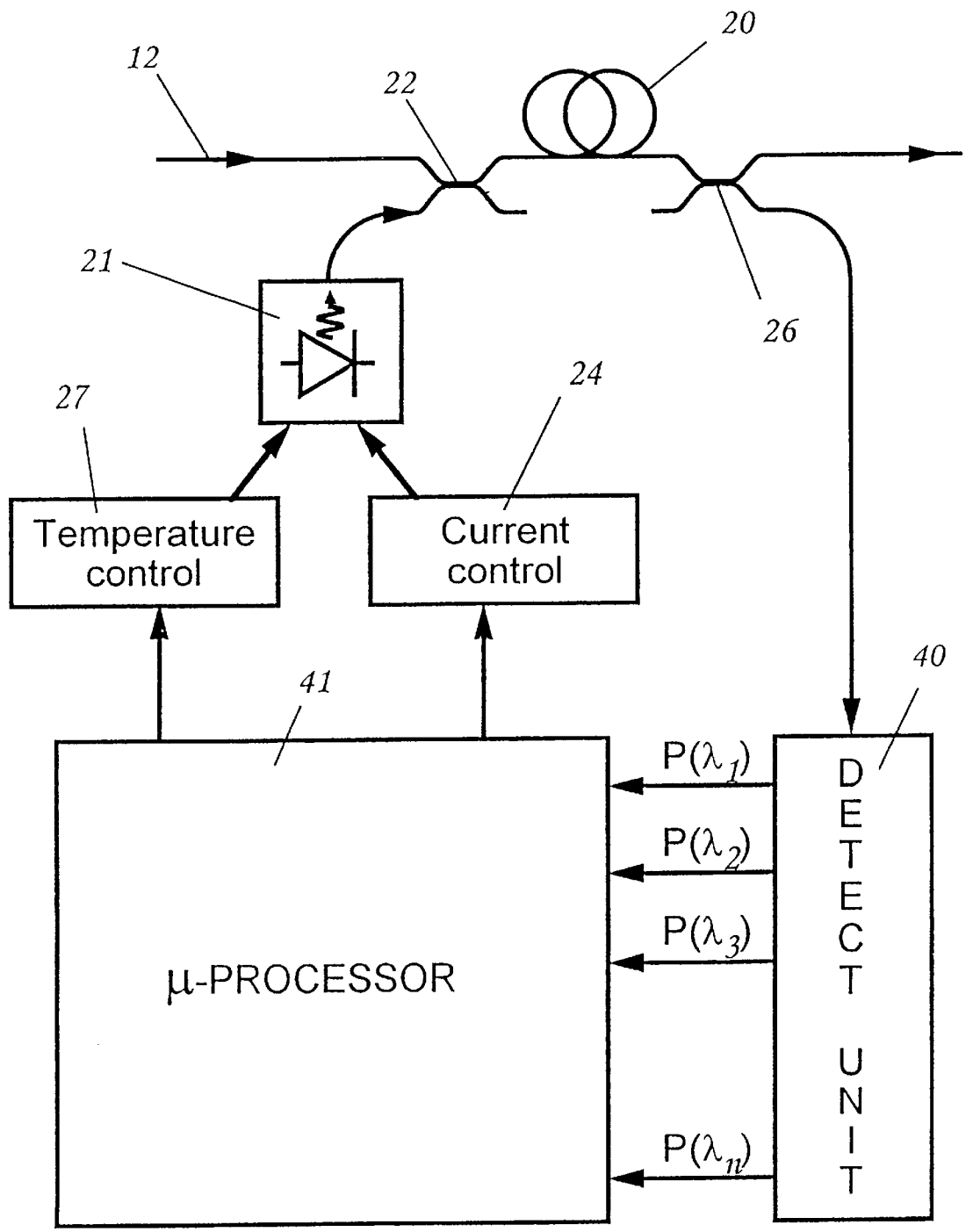

The amplifier of FIG. 16 regulates the temperature of the laser diode of its pump 21, not so as to stabilize the emission wavelength, but so as to minimize the disparity in power at the output of the amplifier appearing in the spectral bands of two or more of the multiplexed signal channels that the amplifier amplifies. The amplifier of FIG. 16 has the same components as that of FIG. 14 except for the replacement of the feedback loop 25 and wavelength control unit 28 of the amplifier of FIG. 14 with a detector unit 40 and microprocessor 41. The signal tapped off the output of the amplifier by the optical coupler 26 and fed to the detector unit 40 is demultiplexed in that unit and detected to provide separate outputs $P(\lambda_1)$, $P(\lambda_2)$ . . . $P(\lambda_n)$ to the microprocessor 41 representative, typically in digital form, of the relative powers detected in each of the WDM channel bands $\lambda_1$, $\lambda_2$ . . . $\lambda_n$.

For this purpose the detector unit 40 may be implemented by a WDM demultiplexing filter that separates the WDM channels into separate fibers, each fiber terminating in a PIN diode followed by a transimpedance amplifier. The voltage output of each transimpedance amplifier is converted to digital form by an A to D converter operating for instance at 1 kHz. An alternative implementation of the function of the detector unit 40 is as disclosed in U.S. Pat. No. 5,513,029 and employs orthogonal dithers modulated on each of the WDM channels to enable the determination of the power present in each channel without requiring the use of wavelength selective filters or multiple PIN diodes.

The microprocessor 41 provides a first output, fed to the current controller 24, to regulate the power output of the pump 21, and provides a second output fed to the temperature controller 27 to regulate the temperature of the laser diode of pump 21 in such a way as to minimize the power disparity between some or all of the power levels $P(\lambda_1)$ to $P(\lambda_n)$. Typically this will be arranged to involve only those power levels $P(\lambda_1) \ldots P(\lambda_n)$ that exceed a certain threshold value. This is so that no account is taken of channels that are inoperative because of a fault condition, or because they have been deliberately shut down.

Figure 17:
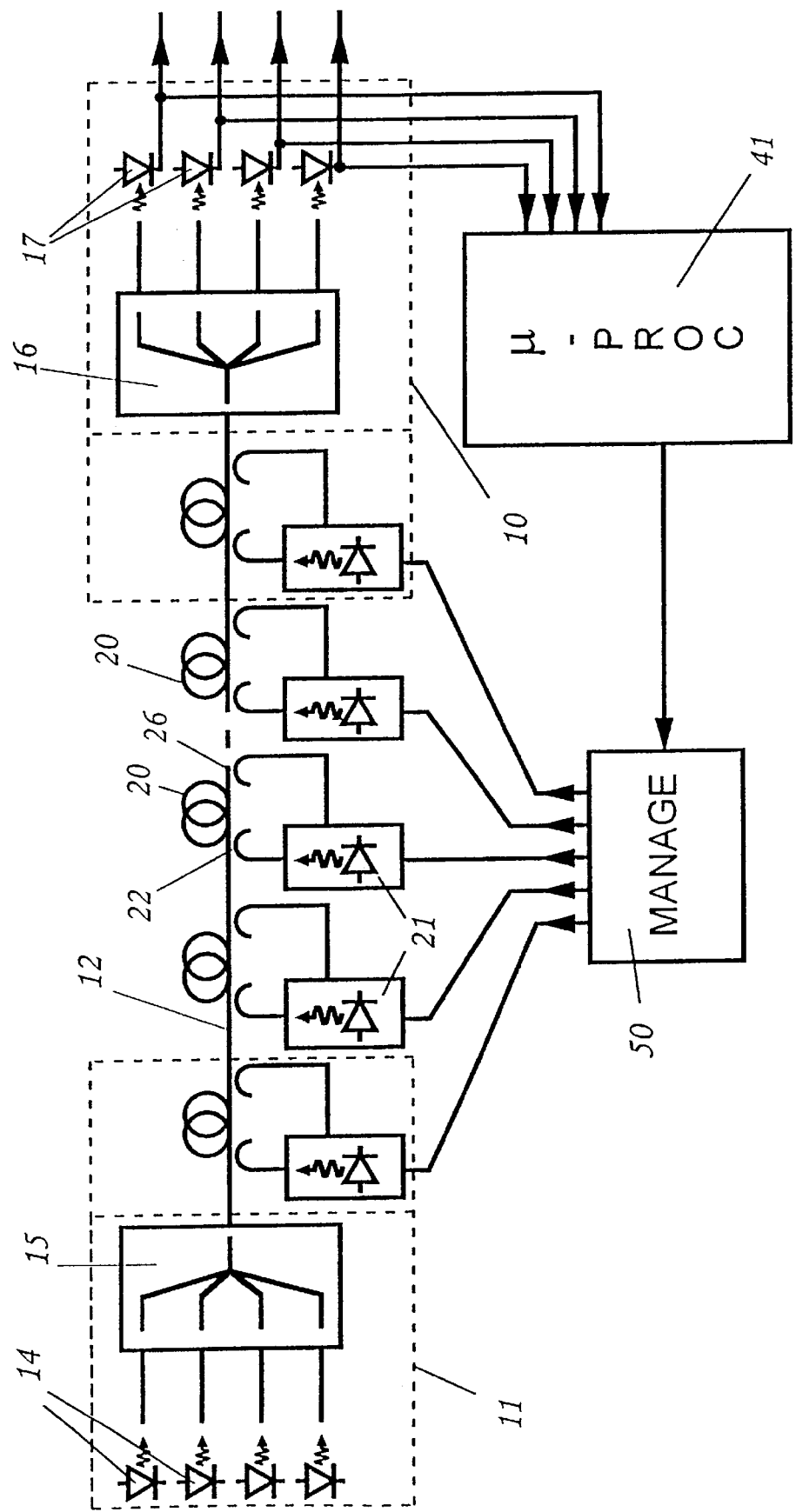
FIG. 17 schematically depicts a modified form of the WDM transmission system of FIG. 13.

In the transmission system of FIG. 17 the final optical amplifier of the transmission path 12 is included as part of the receiver 10, and employs essentially the same sort of temperature regulation as employed in the amplifier of FIG. 16. In this instance the output of the microprocessor 41 is not used to control solely the temperature controller of the laser diode of the pump 21 of that amplifier alone, but instead is used to control the temperatures of the pumps 21 of all the amplifiers 21 in the transmission path 12 via a system management unit 50.

The version of the detector unit 40 of the amplifier unit of FIG. 16 described above that employs multiple PIN diodes performs three functions. First it demultiplexes the channels, then it separately detects the demultiplexed channels, and finally it converts those detected signals into power measurement signals for input into the microprocessor 41. In the case of the transmission system of FIG. 17, the first two of these functions are already performed respectively by the demultiplexer 16 and detectors 17 of the receiver, while the third function is incorporated into the microprocessor 41 so as to be able to dispense with the need for the separate detector unit 40.

The transmission system of FIG. 17 will function in essentially the same way even though the final amplifier of the concatenation be located not in the receiver but at a point in the transmission path physically remote from the receiver. Under these circumstances, rather than saying that it is the disparity in power in different spectral bands at the output of the final amplifier that is being used for regulating the temperature of the pump laser diodes, it is more correct to say that it is the disparity at the receiver which is being so employed.

Although specific embodiments of the invention have been described and illustrated, it is to be understood that modifications can be made without departing from the invention's spirit and scope. For example, in addition to the above criteria for selecting a pump wavelength, the fact that the operating wavelength of a semiconductor laser changes with age can also be included in the selection process. Thus, a pump wavelength which initially is not optimal may be chosen so that with time the laser will age through the optimum, but will never be excessively far from the optimum throughout its usable life.

Similarly, it is known that the output spectrum of a pump laser can exhibit fluctuations due to, for example, mode hopping. To minimize this effect, one may choose a compromise pump wavelength which is not necessarily optimum for the desired shape of the gain spectrum but is relatively insensitive to pump laser fluctuations.

As another variation, in an analog optical transmission system, e.g., a system employing subcarrier multiplexing, the gain slope (i.e. $\Delta G/\Delta\lambda$) is an important parameter one might opt to exercise control over. Accordingly, for this case, instead of the criteria discussed above, gain slope could be used as the property of the gain spectrum used to select a pump wavelength within a pump band.

As a further variation, in a transmission system having a plurality of optical amplifiers the pump laser-diodes may have different wavelengths but they must all fall within the allowed windows.

A variety of other modifications which do not depart from the scope and spirit of the invention will be evident to persons of ordinary skill in the art from the disclosure herein. The following claims are intended to cover the specific embodiments set forth herein as well as such modifications, variations, and equivalents.

TABLE 1

Selecting the range of pump wavelengths

| Signal wavelength range (nm) | Pump wavelength range (nm) | Comments |
| --- | --- | --- |
| 1540–1560 | 970–986 | effect in red band not as significant as in blue band |
| 1528–1565 | 970–977, 981–986 | Average |
| 1528–1565 | 974–975, 981–983 | Better |
| 1528–1565 | 974.5–975, 982–983 | Best |
| 1530–1565 | 970.–977, 981–986 | Average |
| 1530–1565 | 974–976, 981–984 | Better |
| 1530–1565 | 974–975, 982–983 | Best |

TABLE 2

Selecting the range of pump wavelengths

| Signal wavelength range (nm) | Pump wavelength range (nm) | Pump Wavelength Window in upper and lower range | Comments |
| --- | --- | --- | --- |
| 1540–1560 | 970–986 | | effect in red band not as significant as in blue band |
| 1528–1565 | 970–977, 981–986 | Anywhere in range | Average |
| 1528–1565 | 970–975, 982–986 | 2 nm window | Good |
| 1528–1565 | 970–975, 981–986 | 1 nm window | Better |
| 1528–1565 | 970–976, 981–986 | 0.5 nm window | Best |
| 1530–1565 | 970–977, 981–986 | Anywhere in range | Average |
| 1530–1565 | 970–977, 981–986 | 2 nm window | Good |
| 1530–1565 | 970–977, 981–986 | 1 nm window | Better |
| 1530–1565 | 970–977, 981–986 | 0.5 nm window | Best |

What is claimed is:

1. A method for adjusting the gain spectrum of an optical amplifier, said optical amplifier comprising an optical amplifying medium and a pump which supplies pump power to the medium in a pump band, said pump power having a spectrum which has a center wavelength, said method comprising adjusting the value of the center wavelength within the pump band to change the shape of the gain spectrum of the optical amplifier while maintaining gain at about the same level for signal wavelength of said optical amplifier.

2. The method of claim 1 wherein the optical amplifier comprises an additional pump, said additional pump supplying additional pump power to the medium in the pump band, said additional pump power having a spectrum which has a center wavelength, said method comprising the additional step of adjusting the value of the center wavelength of said additional pump power within the pump band to change the shape of the gain spectrum of the optical amplifier.

3. A method of operating an optical amplifier, said optical amplifier having a gain spectrum and comprising an optical amplifying medium and a pump which supplies pump power to the medium in a pump band, said pump power having a spectrum which has a center wavelength, said method comprising controlling the value of the center wavelength within the pump band to control the gain spectrum of the optical amplifier while maintaining the gain at about the same level at one signal wavelength of the optical amplifier.

4. The method of claim 3 further comprising controlling the magnitude of the pump power supplied to the medium to control the gain spectrum of the optical amplifier.

5. The method of claim 4 wherein the magnitude of the pump power is controlled using an attenuator located between the pump and the optical amplifying medium.

6. The method of claim 3 wherein the value of the center wavelength is controlled to within two nanometers.

7. The method of claim 3 wherein the value of the center wavelength is controlled to within one nanometer.

8. The method of claim 3 wherein the value of the center wavelength is controlled to within a half a nanometer.

9. A method of operating an optical amplifier, said optical amplifier having a gain spectrum and comprising an optical amplifying medium and a pump which supplies pump power to the medium in a pump band, said pump power having a spectrum which has a center wavelength, said method comprising applying a set of signal wavelengths to the optical amplifier and selecting a pump center wavelength within the pump band, said selected pump center wavelength providing a gain spectrum for the set of signal wavelengths which is preferred based on at least one criterion compared to the gain spectrum produced by at least one other pump center wavelength within the pump band.

10. The method of claim 9 wherein the pump band comprises the wavelengths between about 975 nanometers and about 985 nanometers.

11. The method of claim 9 wherein the at least one criterion comprises the flatness of the gain spectrum in at least one wavelength region.

12. The method of claim 11 wherein the at least one wavelength region is from about 1525 nanometers to about 1540 nanometers.

13. The method of claim 9 wherein the at least one criterion comprises reducing the differences between the magnitudes of the gain spectrum for the set of signal wavelengths.

14. The method of claim 9 wherein first and second sets of signal wavelengths are applied to the amplifier and the at least one criterion comprises compromising between reducing the difference between the magnitudes of the gain spectrum at the first set of signal wavelengths and reducing the difference between the magnitudes of the gain spectrum at the second set of signal wavelengths.

15. The method of claim 9 wherein the at least one criterion comprises reducing the effects of aging of the pump on the gain spectrum.

16. The method of claim 9 wherein the pump is a laser and the at least one criterion comprises reducing the effects of mode hopping on the gain spectrum.

17. The method of claim 9 wherein the at least one criterion comprises reducing the effects of dynamic gain tilt.

18. The method of claim 9 wherein the amplifier comprises a gain flattening filter and the at least one criterion comprises the effects of the filter on the gain spectrum.

19. The method of claim 9 wherein the at least one criterion comprises the slope of the gain spectrum.

20. The method of claim 9 wherein the optical amplifier is a member of a cascaded series of optical amplifiers and the at least one criterion comprises the effects of amplified spontaneous emission of at least one other member of the series of optical amplifiers.

21. A method of pumping an erbium-doped silica optical fiber amplifier within a transmission system having two or more said amplifiers, the method including selecting a pump light source having a wavelength such that differential gain due to pump light wavelength related effects is substantially reduced while maintaining gain at essentially the same level at one signal wavelength.

22. A method of operating a transmission system having a transmitter and a receiver connected by an optical fiber, and a plurality of optical amplifiers located along said optical fiber to amplify signal channels between said transmitter and receiver, each of said amplifiers having a source of pump light, said method including selecting the wavelength of said source such that contributions to differential gain due to pump light wavelength related effects are substantially reduced while maintaining gain at essentially the same level at one signal wavelength.

23. A method of operating a transmission system having a plurality of optical amplifiers, each optical amplifier comprising an erbium-doped silica fiber and a source of pump light said method including:

(i) selecting the wavelength of the source of pump light to lie within a range of 970 nm to 977 nm or 981 nm to 986 nm and, therefore, excluding highly absorbable wavelengths in range of 978 nm to 980 nm, and (ii) utilizing the selected wavelength to adjust gain spectrum shape.

24. A method as claimed in claim 23, wherein the method includes selecting the wavelength of the source to lie within the range 974 nm to 975 nm or 981 nm to 983 nm.

25. A method as claimed in claim 23, wherein the method includes selecting the wavelength of the source to lie in the range 974.5 nm to 975 nm or 982 nm to 983 nm.

26. A method as claimed in claim 23, wherein the plurality of optical amplifiers is arranged to amplify signals the wavelengths of which lie in the range 1530 nm to 1565 nm.

27. A method as claimed in claim 26, wherein the method includes selecting the wavelength of the source to lie within the range 974 nm to 976 nm or 981 nm to 984 nm.

28. A method as claimed in claim 26, wherein the method includes selecting the wavelength of the source to lie within the range 974 nm to 975 nm or 982 nm to 983 nm.

29. A method of operating a transmission system having a plurality of optical amplifiers, each optical amplifier comprising an erbium-doped silica optical fiber and a source of pump light, the method including (i) selecting the wavelength of the source to lie within a 2 nm waveband in the range of 970 nm to 975 nm or 982 nm to 986 nm, thereby excluding highly absorbable wavelengths in 976nm to 981 nm range; and (ii) utilizing said selected wavelength to control gain spectrum shape.

30. A method of operating a transmission system having a plurality of optical amplifiers, each optical amplifier comprising an erbium-doped silica optical fiber and a source of pump light, the method including selecting the wavelength of the source to lie within a 1 nm waveband in the range of 970 nm to 975 nm or 981 nm to 986 nm and utilizing said selected wavelength to control gain spectrum shape.

31. A method of operating a transmission system having a plurality of optical amplifiers, each optical amplifier comprising an erbium-doped silica optical fiber and a source of pump light, the method including (i) selecting the wavelength of the source to lie within a 0.5 nm waveband in the range of 970 nm to 976 nm or 981 nm to 986 nm; and (ii) utilizing said selected wavelength to control gain spectrum shape.

32. A method of operating a transmission system having a plurality of optical amplifiers arranged to amplify signals, the wavelengths of which lie in the range 1530 nm to 1565 nm, each optical amplifier comprising an erbium-doped silica optical fiber and a source of pump light, the method including
(i) selecting the wavelength of the source to lie within a 2 nm waveband in the range of 970 nm to 977 nm or 981 nm to 986 nm; and
(ii) utilizing said selected wavelength to control gain spectrum shape.

33. A method as claimed in claim 32, wherein the method includes selecting the wavelength of the source to lie within a 1 nm waveband in the range of 970 nm to 977 nm or 981 nm to 986 nm.

34. A method as claimed in claim 32, wherein the method includes selecting the wavelength of the source to lie within a 0.5 nm waveband in the range of 970 nm to 977 nm or 981 nm to 986 nm.

35. A method of operating an optical amplifier having an optically amplifying medium optically pumped with a semiconductor laser, in which method the shape of the gain spectrum is regulated by dynamic control of the emission wavelength of the laser while maintaining gain at about the same level at one signal wavelength.

36. A method of operating an optical amplifier having an optically amplifying medium optically pumped with a semiconductor laser, in which method a feedback control loop is employed to control the magnitude of pump power delivered to the amplifying medium by the laser to control the shape of gain spectrum while maintaining gain at about the same level at one signal wavelength, and adjustment mechanism modifying the change in emission wavelength that results directly from changes in said delivered pump power.

37. In a wavelength division multiplexed transmission system having a receiver optically coupled with a transmitter via a wavelength division multiplexed transmission path that includes a concatenation of laser diode pumped optical amplifiers, each of which exhibits a gain spectrum, a method of adjusting the shape of the gain spectrum of at least one of said amplifiers by dynamically regulating the temperature of its laser diode pump in response to a measured operating parameter of said amplifier, or of said system.

38. In a wavelength division multiplexed transmission system having a receiver optically coupled with a transmitter via a wavelength division multiplexed transmission path that includes a concatenation of laser diode pumped optical amplifiers, each of which exhibits a gain spectrum, a method of adjusting, the shape of the gain spectrum of said amplifier by dynamically regulating the temperature of its laser diode pump in response to variations in magnitude of a drive current applied to the laser diode pump of the amplifier.

39. In a wavelength division multiplexed transmission system having a receiver optically coupled with a transmitter via a wavelength division multiplexed transmission path that includes a concatenation of laser diode pumped optical amplifiers, each of which exhibits a gain spectrum, a method of adjusting, the gain spectrum of said amplifier in response to variations in wavelength of emission of the laser diode pump of the amplifier while maintaining fixed gain at about the same level, at any one of the wavelengths.

40. In a wavelength division multiplexed transmission system having a receiver optically coupled with a transmitter via a wavelength division multiplexed transmission path that includes a concatenation of laser diode pumped optical amplifiers, each of which exhibits a gain spectrum, a method of adjusting, the gain spectrum of at least one of said amplifiers, which amplifier is amplifying at least two wavelength division multiplexed signals, by dynamically regulating the temperature of its laser diode pump in response to a difference in power output from the amplifier of said signals.

41. In a wavelength division multiplexed transmission system having a receiver optically coupled with a transmitter via a wavelength division multiplexed transmission path that includes a concatenation of laser diode pumped optical amplifiers, each of which exhibits a gain spectrum, a method of adjusting, as claimed in claim 40, the gain spectrum of said amplifier, and wherein said difference in power output is additionally employed for dynamically regulating the temperature of the laser diode pump of at least one other amplifier of the concatenation.

42. In a wavelength division multiplexed transmission system having a receiver optically coupled with a transmitter via a wavelength division multiplexed transmission path that includes a concatenation of laser diode pumped optical amplifiers, each of which exhibits a gain spectrum, a method of adjusting the gain spectrum of said system by dynamically regulating the temperature of the pump laser diode of at least one of the amplifiers in response to a difference in power output at the receiver between at least two wavelength division multiplexed signals received from the transmitter by the receiver.

43. A method for making an optical amplifier, said optical amplifier having a gain spectrum, said method comprising:
a) providing an amplifying medium;
b) providing a pump for supplying pump power to the amplifying medium in a pump band, said pump power having a spectrum which has a center wavelength; and
c) providing a gain flattening filter;
wherein the pump and the gain flattening filter are chosen so that adjustments to the value of the center wavelength within the pump band can be used to adjust the gain spectrum of the amplifier so that the gain spectrum meets at least one criterion while maintaining gain at about the same level one signal wavelength.

44. The method of claim 1, 3, 9, or 43 wherein the optical amplifying medium is an erbium doped optical waveguide fiber and the pump is a semiconductor laser operating in the 980 nanometer band.

45. An optical amplifier having a gain spectrum and comprising: an optical amplifying medium; a pump which supplies pump power to the medium in a pump band, said pump power having a spectrum which has a center wavelength; and means for controlling the value of the center wavelength within the pump band to control the shape of the gain spectrum while maintaining gain at about the same level at one signal wavelength.

46. The optical amplifier of claim 45 further comprising:
a) an additional pump, said additional pump supplying additional pump power to the medium in the pump band, said additional pump power having a spectrum which has a center wavelength; and
b) additional means for controlling the value of the center wavelength of said additional pump power within the pump band to control the shape of the gain spectrum.

47. The optical amplifier of claim 45 further comprising means for controlling the magnitude of the pump power supplied to the medium to control the shape of the gain spectrum.

48. The optical amplifier of claim 47 wherein the means for controlling the magnitude of the pump power supplied to the medium comprises an attenuator located between the pump and the optical amplifying medium.

49. The optical amplifier of claim 45 further comprising a gain flattening filter.

50. The optical amplifier of claim 45 wherein the optical amplifying medium is an erbium doped optical waveguide fiber and the pump is a semiconductor laser operating in the 980 nanometer band.

51. An optical amplifier having an optically amplifying medium optically pumped with a semiconductor laser, the amplifier including control means that regulates the shape of the gain spectrum by dynamic control of the emission wavelength of the laser while maintaining gain at about the same level at one signal wavelength.

52. An optical amplifier having an optically amplifying medium optically pumped with a semiconductor laser, the amplifier including a feedback loop controlling the magnitude of pump power delivered to the amplifying medium by the laser to control the shape of gain spectrum, and including an adjustment mechanism that
  (i) modifies the change in emission wavelength at said laser, said change in said emission wavelength resulting directly from changes in said delivered pump power, and
  (ii) keeps this change from becoming larger than 2 nm.

53. An optical amplifier having a gain spectrum and comprising an optically amplifying medium optically pumped with a laser diode whose temperature is dynamically regulated at least in part by a signal derived from a measured operating parameter of the amplifier so as to adjust the shape of said gain spectrum while maintaining gain at about the same level at one signal wavelength.

54. An optical amplifier having a gain spectrum and comprising an optically amplifying medium optically pumped with a laser diode whose temperature is dynamically regulated at least in part by a signal derived from a measured operating parameter of the amplifier so as to adjust the shape of said gain spectrum wherein the laser diode emits light in response to a drive current caused to flow through the laser, and said operating parameter is said drive current.

55. An optical amplifier as claimed in claim 53, wherein the laser diode emits light at a wavelength, which wavelength constitutes said operating parameter.

56. A transmission system having a transmitter and a receiver connected by an optical fiber, and a plurality of optical amplifiers located along said optical fiber to amplify signal channels between said transmitter and receiver, each of said amplifiers having a pump light source the wavelength of which is such that contributions to differential gain due to pump light wavelength related effects are substantially reduced, while maintaining gain at about the same level at one of the signal wavelength.

57. A transmission system as claimed in claim 56, wherein the source of pump light is a semi-conductor laser.

58. A transmission system having a plurality of optical amplifiers, each optical amplifier comprising an erbium-doped silica fiber and a source of pump light, wherein the wavelength of the source of pump light lies within a range of 970 nm to 977 nm or 981 nm to 986 nm and said wavelength is used to control gain spectrum shape.

59. A system as claimed in claim 58, wherein the wavelength of the source lies within the range 974 nm to 975 nm or 981 nm to 983 nm.

60. A system as claimed in claim 58, wherein the wavelength of the source lies in the range 974.5 nm to 975 nm or 982 nm to 983 nm.

61. A system as claimed in claim 58, wherein the plurality of optical amplifiers is arranged to amplify signals the wavelengths of which lie in the range 1530 nm to 1565 nm.

62. A system as claimed in claim 61, wherein the wavelength of the source lies within the range 974 nm to 976 nm or 981 nm to 984 nm.

63. A system as claimed in claim 61, wherein the wavelength of the source lies within the range 974 nm to 975 nm or 982 nm to 983 nm.

64. A transmission system having a plurality of optical amplifiers, each optical amplifier comprising an erbium-doped silica optical fiber and a source of pump light, wherein the wavelength of the source lies within a 2 nm waveband in the range of 970 nm to 975 nm or 982 nm to 986 nm.

65. A transmission system having a plurality of optical amplifiers, each optical amplifier comprising an erbium-doped silica optical fiber and a source of pump light, wherein the wavelength of the source lies within a 1 nm waveband in the range of 970 nm to 975 nm or 981 nm to 986 nm.

66. A transmission system having a plurality of optical amplifiers, each optical amplifier comprising an erbium-doped silica optical fiber and a source of pump light, wherein the wavelength of the source lies within a 0.5 nm waveband in the range of 970 nm to 976 nm or 981 nm to 986 nm.

67. A transmission system having a plurality of optical amplifiers arranged to amplify signals, the wavelength of which lie in the range 1530 nm to 1565 nm, each optical amplifier comprising an erbium-doped silica optical fiber and a source of pump light, wherein the wavelength of the source lies within a 2 nm waveband in the range of 970 nm to 977 nm or 981 nm to 986 nm.

68. A system as claimed in claim 67, wherein the wavelength of the source lies within a 1 nm waveband in the range of 970 nm to 977 nm or 981 nm to 986 nm.

69. A system as claimed in claim 67, wherein the wavelength of the source lies within a 0.5 nm waveband in the range of 970 nm to 976 nm or 981 nm to 986 nm.

* * * * *